US012510391B1

(12) United States Patent
Kasetty et al.

(10) Patent No.: US 12,510,391 B1
(45) Date of Patent: Dec. 30, 2025

(54) SYSTEM FOR THERMAL SHOCK TESTING

(71) Applicant: Zoox, Inc., Foster City, CA (US)

(72) Inventors: Gautham Srinivasprasad Kasetty, Mountain View, CA (US); Juan Luis Cruz, Santa Clara, CA (US)

(73) Assignee: Zoox, Inc., Foster City, CA (US)

( * ) Notice: Subject to any disclaimer, the term of this patent is extended or adjusted under 35 U.S.C. 154(b) by 290 days.

(21) Appl. No.: 18/217,120

(22) Filed: Jun. 30, 2023

(51) Int. Cl.
| | |
|---|---|
| *G01F 1/684* | (2006.01) |
| *G01F 15/00* | (2006.01) |
| *G01F 15/02* | (2006.01) |
| *H05K 1/02* | (2006.01) |

(52) U.S. Cl.
CPC .......... *G01F 1/6847* (2013.01); *G01F 15/005* (2013.01); *G01F 15/024* (2013.01); *H05K 1/0204* (2013.01); *H05K 2201/062* (2013.01); *H05K 2201/064* (2013.01)

(58) Field of Classification Search
CPC .... G01F 1/6847; G01F 15/005; G01F 15/024; H05K 1/0204; H05K 2201/062; H05K 2201/064
See application file for complete search history.

(56) References Cited

U.S. PATENT DOCUMENTS

| | | | | |
|---|---|---|---|---|
| 2017/0227599 A1* | 8/2017 | Wu | ..................... | G01R 31/2875 |
| 2023/0207346 A1* | 6/2023 | Eibl | .................... | G01R 31/2831 62/5 |

\* cited by examiner

*Primary Examiner* — Laura Martin
*Assistant Examiner* — Anthony W Megna Fuentes
(74) *Attorney, Agent, or Firm* — Lee & Hayes, P.C.

(57) ABSTRACT

Systems and techniques for performing a thermal shock test are discussed herein. The thermal shock test system includes a first thermal shock unit associated with a first electronic component, a second thermal shock unit associated with a second electronic component, a first temperature regulator that maintains a first fluid at a first temperature, and a second temperature regulator that maintains a second fluid at a second temperature. The thermal shock test system may be configurable between a first configuration and a second configuration. The first configuration includes the first thermal shock unit being associated with the first fluid and the second thermal shock unit being associated with the second fluid. The second configuration includes the second thermal shock unit being associated with the first fluid and the first thermal shock unit being associated with the second fluid. The thermal shock unit may transition between the first configuration and the second configuration within a time period that causes the first electronic component and the second electronic component to experience a thermal shock. The first electronic component and the second electronic component may be evaluated for failure after the thermal shock.

20 Claims, 5 Drawing Sheets

SYSTEM FOR THERMAL SHOCK TESTING

BACKGROUND

Electronic components (e.g., circuit boards) may fail prematurely during their lifetime. For example, electronic components failures may be caused by temperature, particularly after being subject to ambient temperature swings. For instance, one or more solder joints may fail due to temperature changes. Collecting data over a lifetime of electronic components, however, may be long and tedious. Instead, accelerated tests may be performed on electronic components to simulate an accelerated timeline for failure. For example, a thermal shock test may be performed on electronic components to determine points of failure due to temperature. In addition to being used for accelerated life testing, the thermal shock test may also be used for validation, acceptance or other tests associated with testing electronic components. A thermal shock test may include placing an electronic component on a movable platform within a thermal shock test chamber where the platform is moved between a first portion of the test chamber that is at a high temperature and a second portion of the test chamber that is at a lower temperature. Conventional test chambers, however, may be large, cumbersome, expensive, and/or unreliable. The test chamber may also transition between temperatures slower than optimal (especially for large units under test) because the thermal shock test may be performed using air as a thermal medium.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIG. 5 depicts a block diagram of an example system that a thermal shock test using techniques described herein may be performed on.

DETAILED DESCRIPTION

Figure 1:
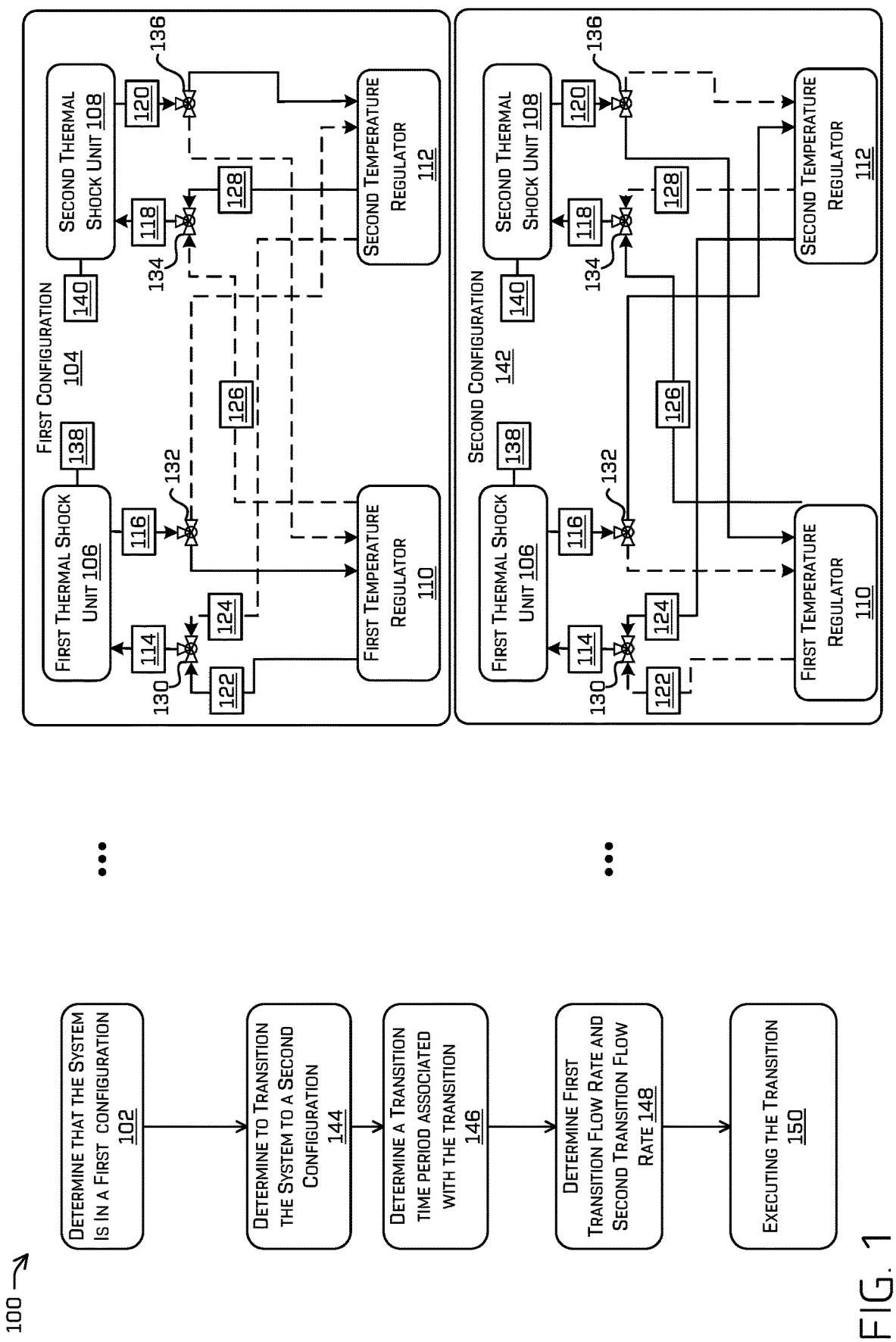
FIG. 1 is a pictorial flow diagram of an example process of operating a system for thermal shock testing.

This application relates to systems and techniques for operating a thermal shock test system. In some examples, the techniques described herein may be used to test one or more electronic components for failures that may result due to extreme temperatures or temperature changes. In some examples, the thermal shock test system may include at least one thermal shock unit, a first temperature regulator configured to house and maintain a first fluid at a first temperature, a second temperature regulator configured to house and maintain a second fluid at a second temperature, and/or various sensors that are configured to measure inlet flow rates of the first and second fluids and temperatures at an inlet and/or an outlet of the thermal shock unit. In some examples, an electronic component may be connected to or placed within the thermal shock test system. In some examples, the techniques described herein may be applied to an electronic component that is powered on. In some examples, the electronic component may be first exposed to the first temperature via the first fluid for a period of time (e.g. for 30 minutes). In some examples, after being exposed to the first temperature for the period of time, the electronic component may then be exposed to the second temperature via the second fluid. In some examples, the techniques described herein may include changing the temperature associated with the thermal shock unit from the first temperature to the second temperature within a short transition time period (e.g., within 2 minutes) such that the electronic components may experience a sudden temperature shift (e.g., experience a thermal shock). In some examples, the system and technique for operating the thermal shock test system may improve a thermal shock test and facilitate a faster temperature transition and minimize moving parts within the thermal shock test system.

In some examples, the electronic component may be a circuit board. In some examples, the electronic component may include portions that may be sensitive to extreme temperatures and temperature changes. In some examples, repeated rapid exposures to temperature changes may cause those portions to fail. For example, the repeated rapid exposure to temperature changes may crack solder joints, substrate materials, and/or the like. In some examples, the electronic component may be exposed to a first temperature for a first time period. In some examples, the first temperature may be an extreme cold temperate (e.g., −10 Celsius or lower). In some examples, the electronic component may then be exposed to a rapid temperature change to a second temperature. In some examples, the second temperature may be an extreme hot temperature (e.g., 75 Celsius or higher). In some examples, the electronic component may be exposed to the second temperature for a second time period. In some examples, after the electronic component has been exposed to the second temperature for the second time period, the electronic component may be evaluated for failure. In some examples, this process may be repeated for multiple cycles prior to evaluating the electronic component for failure.

In some examples, the electronic component may be thermally coupled with a thermal shock unit. In some examples, the thermal shock unit may be configured such that, during a thermal shock test, a fluid may pass through the thermal shock unit from an inlet of the thermal shock unit to an outlet of the thermal shock unit.

In some examples, the electronic component may be placed within the thermal shock unit. In such an example, the thermal shock unit may be sized to house the electronic component. When the electronic component is placed within the thermal shock unit, the fluid passing through the thermal shock unit may make direct contact with the electronic component and directly expose the electronic component to a temperature of the fluid (e.g., the first temperature or the second temperature). In such an example, the fluid may be an electrically non-conductive fluid.

In some examples, the thermal shock unit may alternatively be attached or otherwise physically coupled to the electronic component. In such an example, the thermal shock unit may be configured to be attached to one or more portions of the electronic component that may be vulnerable to extreme temperatures and/or temperature changes. Furthermore, in such an example, the thermal shock unit may be a thermal chamber that's configured to thermally regulate a temperature of the electronic component. In some examples, one or more outside surfaces of the thermal shock unit may directly contact the electrical component. In some examples, while the fluid passes through the thermal shock unit, the fluid may be sealed within the thermal shock unit and therefore does not make direct contact with the electronic component. Instead, the one or more outside surfaces that directly contact the electronic component may be thermally conductive, thereby configured to thermally transfer the temperature of the fluid to the electronic component. Alternatively, in some examples, the thermal shock unit may be an integrated active thermal transfer (e.g., heating or cooling) component of the electronic component for use when the electronic component is fielded (e.g., in its intended use case in a larger assembly such as a vehicle). Examples of such a thermal shock unit may be, but not limited to, a cold plate, a vapor chamber, or the like. In such an example, the thermal shock unit may be a thermal chamber that may be configured to, during normal operation of the electronic component, thermally regulates a temperature of the electronic component (e.g., keeping the electronic component at or below a threshold temperature) when a liquid passes through the thermal chamber and may be coupled to the thermal shock system while a thermal shock test is being performed.

In some examples, the thermal shock unit may be configured to be associated with a single electronic component. In some examples, the thermal shock system may be used to test a plurality of electronic components. In such an example, the thermal shock system may be extensible such that each electronic component of the plurality of electronic components may be associated with a different thermal shock unit, such that the electronic components may be sequentially tested. For example, a first electronic component may be associated with a first thermal shock unit, a second electronic component may be associated with a second thermal shock unit, and an n-th electronic component may be associated with an n-th thermal shock unit. In some examples, the first electronic component may first be exposed to the first temperature and the second electronic component may first concurrently be exposed to the second temperature. In some examples, during the temperature change, the first electronic component may be transitioned from the first temperature to the second temperature while the second electronic component may be concurrently transitioned from the second temperature to the first temperature.

In some examples, the thermal shock unit may be connected to a first temperature regulator (also referred to as a first temperature regulating device) and a second temperature regulator (also referred to as a second temperature regulating device). In some examples, the first temperature regulator may be sized to house a first fluid and maintain the first fluid at the first temperature. In some examples, the second temperature regulator may be sized to house a second fluid and maintain the second fluid at the second temperature. In some examples, the first and second fluids may comprise a liquid. Alternatively, in some examples, the first and second fluid may comprise a gas. In some examples, the first temperature regulator and the second temperature regulator may be the same size. In some examples, the first fluid may flow from the first temperature regulator to the thermal shock unit and from the thermal shock unit to the first temperature regulator in a closed loop fashion. In some examples, the second fluid may also flow from the second temperature regulator to the thermal shock unit and from the thermal shock unit to the second temperature regulator in a closed loop fashion. In some examples, the thermal shock test system may be configured such that only one of the first fluid or the second fluid may pass through the thermal shock unit. For example, during a first period of time, only the first fluid may pass through the thermal shock unit from the first temperature regulator and during a second period of time after the first period of time, only the second fluid may pass through the thermal shock unit from the second temperature regulator. In the example where the system comprises multiple thermal shock units such as two thermal shock units, during the first period of time, the first fluid may pass through the first thermal shock unit from the first temperature regulator while the second fluid may pass through the second thermal shock unit from the second temperature regulator. In some examples, during the second period of time, the first fluid may pass through the second thermal shock unit from the first temperature regulator while the second fluid may pass through the first thermal shock unit from the second temperature regulator.

In some examples, the thermal shock test system may include one or more additional temperature regulators. In some examples, an additional temperature regulator may be associated with the first fluid and may be operationally connected to the first temperature regulator and the thermal shock unit. In some examples, the additional temperature regulator may be configured as a temperature regulator to receive the first fluid from the thermal shock unit. In some examples, the additional temperature regulator may be a same size as the first temperature regulator and the second temperature regulator. In some examples, the additional temperature regulator may be configured to transfer the first fluid to the first temperature regulator based on a volume of the first fluid inside the additional temperature regulator exceeding an upper volume threshold and/or a volume of the first fluid in inside the first temperature regulator being lower than a lower volume threshold. In some examples, the thermal shock test system may be configured such that the volume of the first temperature regulator and the volume of the additional temperature regulator may be equal. In some examples, the additional temperature regulator may alternatively be associated with the second fluid and operationally connected to the second temperature regulator and the thermal shock unit. In some examples, each of the first fluid and the second fluid may be associated with its own additional temperature regulator.

In some examples, the first temperature regulator may be associated with a first inlet fluid line that operatively connects an outlet of the first temperature regulator to an inlet of the thermal shock unit and a first outlet fluid line that operatively connect an outlet of the thermal shock unit to an inlet of the first temperature regulator. In some examples, the second temperature regulator may be associated with a second inlet fluid line that operatively connect an outlet of the second temperature regulator to the inlet of the thermal shock unit and a second outlet fluid line that operatively connect the outlet of the thermal shock unit to an inlet of the second temperature regulator. In some examples, the first inlet fluid line, the second inlet fluid line, the first outlet fluid line, and the second outlet fluid line may be configured to be thermally insulated to minimize a temperature of an ambient environment from impacting the temperature of the first fluid and the second fluid.

In some examples, the first inlet fluid line and the second inlet fluid line may be connected to a first valve. In some examples, the first valve may be a three-way valve with two inlets, one connected to the first inlet fluid line and one connected to the second inlet fluid line and one outlet connect to the inlet of the thermal shock unit. In some examples, the first valve may be configured such that only one of its inlets may be open at any given time. For example, the inlet associated with the first inlet fluid line may be open and the inlet associated with the second inlet fluid line may be closed.

In some examples, the first outlet fluid line and then second outlet fluid line may be connected to a second valve. In some examples, the second valve may be a three-way valve with one inlet connected to the outlet of the thermal shock unit and two outlets, one connected to the first outlet fluid line and one connected to the second outlet fluid line. In some examples, the second valve may be configured such that only one of its outlets may be open at any given time. For example, the outlet associated with the first outlet fluid line may be open and the outlet associated with the second outlet fluid line may be closed.

In some examples, the inlet of the thermal shock unit may be associated with a first temperature sensor. In some examples, the first temperature sensor may be configured to measure a temperature of one of the first fluid or the second fluid as it enters the thermal shock unit. In some examples, the outlet of the thermal shock unit may be associated with a second temperature sensor. In some examples, the second temperature sensor may be configured to measure a temperature of one of the first fluid or the second fluid as it exits the thermal shock unit. In some examples, a measurement from the first temperature sensor may be different from the measurement from the second temperature sensor. In some examples, this difference in temperature may be due to the one of the first fluid or the second fluid being exposed to a temperature of an ambient environment during its journey from the first temperature regulator to the thermal shock unit and back. In some examples, the difference in temperature may be due to a temperature of the electronic component during the thermal transfer between the first fluid or the second fluid with the electronic component. In some examples, if a difference in temperature is determined, a flow rate associated with the one of the first fluid or the second fluid may be adjusted such that this temperature difference is eliminated or substantially eliminated.

In some examples, the first inlet fluid line may be associated with a first flow sensor. In some examples, the first flow sensor may be configured to measure a first flow rate associated with the first fluid. In some examples, the second inlet fluid line may be associated with a second flow sensor. In some examples, the second flow sensor may be configured to measure a second flow rate associated with the second fluid. In some examples, the first flow sensor may be used in connection with the first and second temperature sensors to adjust the first flow rate to eliminate the temperature difference. In some examples, the second flow sensor may be used in connection with the first and second temperature sensors to adjust the second flow rate to eliminate the temperature difference.

In some examples, during a transition from the first fluid to the second fluid, a transition time period may be determined. In some examples, the transition time period may be determined to be sufficiently short such that the electrical component experiences a sudden temperature change from the first temperature to the second temperature rather than a gradual temperature change (e.g., experiences a thermal shock). In some examples, the transition time period may be determined based on one or more properties associated with one or more components of the thermal shock test system (e.g., a specific heat associated with the first fluid, a specific heat associated with the second fluid, a specific heat capacity associated with the first temperature regulator 110, a specific heat capacity associated with the second temperature regulator 112), a user input at a user interface associated with thermal shock system, and/or the like. In some examples, a first transition flow rate may be determined in association with the transition time period. In some examples, the first transition flow rate may be a constant flow rate that is associated with a temperature change from the first temperature to the second temperature. In some examples, the first transition flow rate may be an initial first transition flow rate. In some examples, the first transition flow rate may be determined using the second flow sensor. In such an example, a first rate of change of the temperature associated with the first transition flow rate may be determined. In some examples, the first rate of change of the temperature may be determined based on the measurement of at least one of the first temperature sensor or the second temperature sensor. In some examples, the first rate of change of the temperature may be determined to be insufficient to change the temperature from the first temperature to the second temperature. In some examples, the first rate of change of the temperature may be determined to be insufficient when the rate of change is below a first rate of change threshold. In such an example, the first transition flow rate may be adjusted such that the rate of change of the temperature becomes fast enough to make the transition within the transition time period. In some examples, the adjustment to the first flow rate may be determined based on the measurement from the second flow sensor and at least one of the first temperature sensor or the second temperature sensor.

The thermal shock test techniques described herein may improve a function of the thermal shock test by providing a robust method of performing a thermal shock test using minimal moving components. In the context of the thermal shock unit, the first temperature regulator, and the second temperature regulator, the thermal shock test system may be modular such that each component (e.g., the temperature regulators, the thermal shock units, and the like) may be separated and sized such that each component may be portable and easy to transport and therefore, the system as a whole may be easy to transport. In addition, the thermal shock system may be extensible to incorporate components (e.g., additional thermal shock units, sensors, temperature regulators, and the like) when necessary (e.g., when testing multiple electronic components) to perform the thermal shock test. For example, if only one electronic component is being tested, the system may include one thermal shock unit. For another example, if two electronic components are being tested, the system may be expanded to include two thermal shock units. In the context of using a liquid to interface with the electrical components, the techniques discussed herein may provide a more rapid temperature transition than using air. These and other improvements to the functioning of the vehicle are discussed herein.

The techniques described herein may be implemented in a number of ways. Example implementations are provided below with reference to the following Figures. Although discussed in the context of testing an electronic component, the methods, apparatuses, and systems described herein may be applied to a variety of systems, and are not limited to testing electronic components. For example, similar techniques may be utilized in testing a thermal resilience of an electromechanical component, a plastic component, a mechanical component, or the like.

FIG. 1 a pictorial flow diagram of an example process 100 of operating a system for thermal shock testing.

An operation 102 may include determining that the system is configured in a first configuration, such as an example first configuration 104, though other configurations are also possible. The example first configuration 104, as illustrated, may include a first thermal shock unit 106, a second thermal shock unit 108, a first temperature regulator 110 (also referred to as a first temperature regulating device), a second temperature regulator 112 (also referred to as a second temperature regulating device), a first temperature sensor 114, a second temperature sensor 116, a third temperature sensor 118, a fourth temperature sensor 120, a first flow sensor 122, a second flow sensor 124, a third flow sensor 126, a fourth flow sensor 128, a first inlet valve 130, a first outlet valve 132, a second inlet valve 134, a second outlet valve 136, a first state determinator 138, and a second state determinator 140. The first configuration 104 also illustrates solid lines and dashed lines between the temperature regulators and the thermal shock units. In the illustrated example, the solid lines and the dashed lines represent the inlet fluid lines (e.g., conduits) and outlet fluid lines (e.g., conduits) that fluidly connect aspects of the thermal shock testing system. More specifically, in the example of FIG. 1, the solid lines represent fluid lines through which a first fluid or a second fluid is being transferred. Conversely, in the illustrated example, the dashed lines represent fluid lines where one of the first fluid or the second fluid is prevented from passing through.

The example first configuration 104 illustrates that the first temperature regulator 110 is operatively connected to the first thermal shock unit 106 and where the first fluid is permitted to pass through to the first thermal shock unit 106 (as illustrated by the solid lines between the first temperature regulator 110 and the first thermal shock unit 106) and the second temperature regulator 112 may be operatively connected to the second thermal shock unit 108 and where the second fluid is permitted to pass through to the second thermal shock unit 108 (as illustrated by the solid lines between the second temperature regulator 112 and the second thermal shock unit 108). In some examples, the first fluid may be associated with a first temperature and may travel from the first temperature regulator 110 to the first thermal shock unit 106 and return to the first temperature regulator 110 after passing through the first thermal shock unit 106. In some examples, the second fluid may be associated with a second temperature and may travel from the second temperature regulator 112 to the second thermal shock unit 108 and return to the second temperature regulator 112 after passing through the second thermal shock unit 108.

In some examples, the first thermal shock unit 106 may house or otherwise be associated with a first electronic component whereby in operation, the first fluid may travel from the first temperature regulator 110 through the first inlet valve 130, into the first thermal shock unit 106 via an inlet associated with the first thermal shock unit 106, out of the first thermal shock unit 106 via an outlet associated with the first thermal shock unit 106, through the first outlet valve 132, and back to the first temperature regulator 110. In some examples, the first thermal shock unit 106 may an integrated part of the first electronic component instead of being a separate component from the first electronic component such that the first thermal shock unit 106 may be coupled to the first electronic component and may be non-destructively removable from the first electronic component . . . In the example where the first thermal shock unit 106 is an integrated part of the first electronic component, the first thermal shock unit 106 may be an active thermal transfer component (e.g., heating or cooling) of the first electronic component. In some examples, this pathway may be closed loop. In some examples, while the first fluid is passing through the first thermal shock unit 106, the first fluid may thermally transfer the first temperature to the first electronic component. In some examples, the first electronic component may be a printed circuit board (PCB). Examples of the electronic component may be, but are not limited to, a single-sided PCB, a double-sided PCB, a multi-layer PCB, a rigid PCB, a flex PCB, a rigid-flex PCB, or the like. In some examples, the first thermal shock unit 106 may alternatively be associated with multiple electronic components. The first thermal shock unit 106 is further discussed in association with FIG. 3, as well as throughout this disclosure.

In some examples, the second thermal shock unit 108 may house or otherwise be associated with a second electronic component whereby in operation, the second fluid may travel from the second temperature regulator 112 through the second inlet valve 134, into the second thermal shock unit 108 via an inlet associated with the second thermal shock unit 108, out of the second thermal shock unit 108 via an outlet associated with the second thermal shock unit 108, through the second outlet valve 136, and back to the second temperature regulator 112. In some examples, similar to the first thermal shock unit 106, the second thermal shock unit 108 may an integrated part of the first electronic component instead of being a separate component from the first electronic component such that the second thermal shock unit 108 may be coupled to the second electronic component and may be non-destructively removable from the second electronic component. In the example where the second thermal shock unit 108 is an integrated part of the second electronic component, the second thermal shock unit 108 may be an active thermal transfer component (e.g., heating or cooling) of the second electronic component. In some examples, similar to the fluid pathway between the first temperature regulator 110 and the first thermal shock unit 106, this pathway may also be closed loop. In some examples, while the second fluid is passing through the second thermal shock unit 108, the second fluid may thermally transfer the second temperature to the second electronic component. In some examples, the second electronic component may be a PCB. Examples of the second electronic component may be, but are not limited to, a single-sided PCB, a double-sided PCB, a multi-layer PCB, a rigid PCB, a flex PCB, a rigid-flex PCB, or the like. In some examples, the second thermal shock unit 108 may also alternatively be associated with multiple electronic components. The second thermal shock unit 108 is further discussed in association with FIG. 3, as well as throughout this disclosure.

In some examples, the first temperature regulator 110 and the second temperature regulator 112 may be associated with both the first thermal shock unit 106 and the second thermal shock unit 108. In some examples, the first fluid may be maintained at the first temperature while within the first temperature regulator 110 (e.g., cooled to the first temperature). In some examples, the second fluid may be maintained at the second temperature while within the second temperature regulator 112 (e.g., heated to the second temperature). In some examples, the first fluid and the second fluid may be the same fluid, but thermally maintained at different temperatures (e.g., the first temperature and the second temperature).

In some examples, the first temperature may be determined to be at or below a first temperature threshold. In some examples, the second temperature may be determined to be at or above a second temperature threshold. In some examples the first temperature threshold may be a lower temperature than the second temperature threshold. In some examples, the first temperature and the second temperature may be determined based on a difference between the first temperature and the second temperature exceeding a temperature difference threshold such that the first temperature may be associated with a cold extreme (e.g., −10 Celsius or lower) and the second temperature may be associated with a hot extreme (e.g., 75 Celsius or warmer). In some examples, the first fluid and the second fluid may comprise one or more liquids. In some examples, the first fluid and the second fluid may alternatively comprise of one or more gases.

In some examples, the first temperature sensor 114 may be positioned proximate the inlet associated with the first thermal shock unit 106 and the second temperature sensor 116 may be positioned proximate the outlet associated with the first thermal shock unit 106, whereby the first temperature sensor 114 may be used to determine a first temperature associated with the first fluid at the inlet associated with the first thermal shock unit 106 and the second temperature sensor 116 may be used to determine a second temperature associated with the first fluid at the outlet associated with the first thermal shock unit 106. In some examples, the first temperature sensor 114 and the second temperature sensor 116 may be used to determine a difference between the first temperature and the second temperature.

In some examples, the third temperature sensor 118 may be positioned proximate the inlet associated with the second thermal shock unit 108 and the fourth temperature sensor 120 may be positioned proximate the outlet associated with the second thermal shock unit 108, whereby the third temperature sensor 118 may be used to determine a third temperature associated with the second fluid at the inlet associated with the second thermal shock unit 108 and the fourth temperature sensor 120 may be used to determine a fourth temperature associated with the second fluid at the outlet associated with the second thermal shock unit 108. In some examples, the third temperature sensor 118 and the fourth temperature sensor 120 may be used to determine a difference between the third temperature and the fourth temperature.

In some examples, the first inlet valve 130 may be associated with the inlet associated with the first thermal shock unit 106. In some examples, the first inlet valve 130 may be operationally connected to both the first temperature regulator 110 and the second temperature regulator 112. In some examples, the first inlet valve 130 may be a three-way valve, whereby the first inlet valve 130 may comprise two inlets, one operationally connected to the first temperature regulator 110 and one operationally connected to the second temperature regulator 112, and one outlet which is operationally connected to the first thermal shock unit 106. In some examples, only one inlet associated with the first inlet valve 130 may be open and allow the one of the first fluid or the second fluid to pass through to the first thermal shock unit 106 based on a current configuration. In the example of example first configuration 104, the inlet associated with the first temperature regulator 110 is open (illustrated in FIG. 1 as a solid line) while the inlet associated with the second temperature regulator 112 is closed (illustrated in FIG. 1 as a dashed line), thereby permitting the first fluid to flow from the first temperature regulator 110 to the first thermal shock unit 106 while preventing the second fluid from flowing to the first thermal shock unit 106.

In some examples, the first outlet valve 132 may be associated with the outlet associated with the first thermal shock unit 106. In some examples, the first outlet valve 132 may be operationally connected to both the first temperature regulator 110 and the second temperature regulator 112. In some examples, the first outlet valve 132 may also be a three-way valve, whereby the first outlet valve 132 may comprise two outlets, one operationally connected to the first temperature regulator 110 and one operationally connected to the second temperature regulator 112, and one inlet which is operationally connected to the first thermal shock unit 106. In some examples, only one outlet associated with the first outlet valve 132 may be open and allow one of the first fluid or the second fluid to pass through to one of the first temperature regulator 110 or the second temperature regulator 112 based on the current configuration. In the example of example first configuration 104, the outlet associated with the first temperature regulator 110 is open (illustrated in FIG. 1 as a solid line) while the outlet associated with the second temperature regulator 112 is closed (illustrated in FIG. 1 as a dashed line), thereby permitting the first fluid to flow from the first thermal shock unit 106 to first temperature regulator 110 while preventing the first fluid from flowing into the second temperature regulator 112.

In some examples, the second inlet valve 134 may be associated with the inlet associated with the second thermal shock unit 108. In some examples, the second inlet valve 134 may be operationally connected to both the first temperature regulator 110 and the second temperature regulator 112. In some examples, the second inlet valve 134 may also be a three-way valve, whereby the second inlet valve 134 may also comprise two inlets, one operationally connected to the first temperature regulator 110 and one operationally connected to the second temperature regulator 112, and one outlet which is operationally connected to the second thermal shock unit 108. In some examples, only one inlet associated with the second inlet valve 134 may be open and allow one of the first fluid or the second fluid to pass through to the second thermal shock unit 108 based on the current configuration. In the example of example first configuration 104, the inlet associated with the second temperature regulator 112 is open (illustrated in FIG. 1 as a solid line) while the inlet associated with the first temperature regulator 110 is closed (illustrated in FIG. 1 as a dashed line), thereby permitting the second fluid to flow from the second temperature regulator 112 to the second thermal shock unit 108 while preventing the first fluid from flowing to the second thermal shock unit 108.

In some examples, the second outlet valve 136 may be associated with the outlet associated with the second thermal shock unit 108. In some examples, the second outlet valve 136 may be operationally connected to both the first temperature regulator 110 and the second temperature regulator 112. In some examples, the second outlet valve 136 may also be a three-way valve, whereby the second outlet valve 136 may comprise two outlets, one operationally connected to the first temperature regulator 110 and one operationally connected to the second temperature regulator 112, and one inlet which is operationally connected to the second thermal shock unit 108. In some examples, only one outlet associated with the second outlet valve 136 may be open and allow one of the first fluid or the second fluid to pass through to one of the first temperature regulator 110 or the second temperature regulator 112 based on the current configuration. In the example of example first configuration 104, the outlet associated with the second temperature regulator 112 is open (illustrated in FIG. 1 as a solid line) while the outlet associated with the first temperature regulator 110 is closed (illustrated in FIG. 1 as a dashed line), thereby permitting the second fluid to flow from the second thermal shock unit 10 to second temperature regulator 112 while preventing the second fluid from flowing into the first temperature regulator 110.

In some examples, the first flow sensor 122 may be positioned proximate the inlet of the first inlet valve 130 that is associated with the first temperature regulator 110. In some examples, the first flow sensor 122 may be used to determine a first flow rate associated with the first fluid flowing from first temperature regulator 110 toward the first thermal shock unit 106. In the example of the example first configuration 104, because the inlet associated with the first temperature regulator 110 is open, the first flow sensor 122 may measure a flow rate greater than zero.

In some examples, the second flow sensor 124 may be positioned proximate the inlet of the first inlet valve 130 that is operationally connected to the second temperature regulator 112. In some examples, the second flow sensor 124 may be used to determine a second flow rate associated with the second fluid flowing from the second temperature regulator 112 toward the first thermal shock unit 106. In the example of the example first configuration 104, because the inlet associated with the second temperature regulator 112 is closed, the first flow sensor 122 may measure a flow rate of zero or approximately zero.

In some examples, the first flow sensor 122 and/or the second flow sensor 124 may operate in conjunction with the first temperature sensor 114 and/or the second temperature sensor 116, whereby, the flow rate of the first fluid and/or the second fluid may be dynamically adjusted to maintain each respective fluid at the first temperature or the second temperature respectively and/or maintain a temperature difference between the first temperature sensor 114 and the second temperature sensor 116 at a target temperature difference threshold. In the example of example first configuration 104, the target temperature difference threshold may be zero or approximately zero. In other examples, the target temperature difference threshold may be non-zero.

Additionally or alternatively, in some examples, the first flow sensor 122 and/or the second flow sensor 124 may be used to determine whether the first inlet valve 130 is operating as intended. For example, in the event that both the first flow sensor 122 and the second flow sensor 124 measure a flow rate greater than zero when at least one of the inlets should be closed, the system may determine, as a result, that both inlets associated with the first inlet valve 130 may be open. In such an example, the system may log a warning and/or notify a user via a user interface associated with the system that the first inlet valve 130 may be faulty.

Additionally, in some examples, additional flow sensors may be positioned proximate each outlet associated with the first outlet valve 132. For example, a first additional flow sensor may be positioned proximate an outlet associated with the first temperature regulator 110 and a second additional flow sensor may be positioned approximate an outlet associated with the second temperature regulator 112. In some examples, the additional flow sensors may be used to determine whether first outlet valve 132 is operating as intended. For example, in the event that both the first additional flow sensor and the second additional flow sensor measure a flow rate greater than zero when at least one of the outlets should be closed, the system may determine that both outlets may be open. In such an example, the system may log a warning and/or notify the user via the user interface that the first outlet valve 132 may be faulty.

In some examples, the third flow sensor 126 may be positioned proximate the inlet of the second inlet valve 134 that is associated with the first temperature regulator 110. In some examples, the third flow sensor 126 may be used to determine a third flow rate associated with the first fluid flowing from first temperature regulator 110 toward the second thermal shock unit 108. In the example of the example first configuration 104, because the inlet associated with the first temperature regulator 110 is closed, the third flow sensor 126 may measure a flow rate of zero or approximately zero.

In some examples, the fourth flow sensor 128 may be positioned proximate the inlet of the second inlet valve 134 that is operationally connected to the second temperature regulator 112. In some examples, the fourth flow sensor 128 may be used to determine a fourth flow rate of the second fluid flowing from the second temperature regulator 112 toward the second thermal shock unit 108. In the example of the example first configuration 104, because the inlet associated with the second temperature regulator 112 is open, the fourth flow sensor 128 may measure a flow rate of greater than zero.

In some examples, the third flow sensor 126 and/or the fourth flow sensor 128 may operate in conjunction with the third temperature sensor 118 and the fourth temperature sensor 120, whereby, the flow rates of the first fluid and/or the second fluid may be dynamically adjusted to maintain the first temperature or the second temperature and/or maintain a temperature difference between the third temperature sensor 118 and the fourth temperature sensor 120 at a target temperature difference threshold. In the example of the example first configuration 104, the target temperature difference threshold may be zero or approximately zero. In other examples, the target temperature difference threshold may be non-zero.

Additionally or alternatively, in some examples, the third flow sensor 126 and/or the fourth flow sensor 128 may be used to determine whether the second inlet valve 134 is operating as intended. For example, in the event that both the third flow sensor 126 and the fourth flow sensor 128 measure a flow rate greater than zero when at least one of the inlets should be closed, the system may determine, as a result, that both inlets associated with the second inlet valve 134 may be open. In such an example, the system may log a warning and/or notify a user via a user interface associated with the system that the second inlet valve 134 may be faulty.

Additionally, in some examples, additional flow sensors may be positioned proximate each outlet associated with the second outlet valve 136. For example, a third additional flow sensor may be positioned proximate an outlet associated with the first temperature regulator 110 and a fourth additional flow sensor may be positioned approximate an outlet associated with the second temperature regulator 112. In some examples, the additional flow sensors may be used to determine whether first outlet valve 132 is operating as intended. For example, in the event that both the third additional flow sensor and the fourth additional flow sensor measure a flow rate greater than zero when at least one of the outlets should be closed, the system may determine that both outlets may be open. In such an example, the system may log a warning and/or notify the user via the user interface that the second outlet valve 136 may be faulty.

In some examples, the first state determinator 138 may be configured to determine an operational state of the first electronic component. In some examples, the first state determinator 138 may continuously determine the operational state of the first electronic component in real time while the thermal shock system is testing the first electronic component such as during each operation of the process 100. Alternatively, the first state determinator 138 may be configured to determine the operational state of the first electronic component at particular intervals such as before and/or after each operation within of the process 100. In some examples, the first state determinator 138 may create a log of the operational state of the first electronic component and/or add to the log when the first state determinator 138 determines the operational state of the first electronic component. In some examples, the first state determinator 138 may be configured to stop the thermal shock test when it determines that the first electronic component is in a non-operational state even if the thermal shock test has not completed all of its planned cycles.

In some examples, the second state determinator 140 may be configured to determine an operational state of the second electronic component. In some examples, the second state determinator 140 may continuously determine the operational state of the second electronic component in real time while the thermal shock system is testing the second electronic component such as during each operation of the process 100. Alternatively, the second state determinator 140 may be configured to determine the operational state of the second electronic component at particular intervals such as such as before and/or after each operation within of the process 100. In some examples, the second state determinator 140 may create a log of the operational state of the second electronic component and/or add to the log when the second state determinator 140 determines the operational state of the second electronic component. In some examples, the second state determinator 140 may be configured to stop the thermal shock test when it determines that the second electronic component is in a non-operational state even if the thermal shock test has not completed all of its planned cycles. In some examples, the thermal shock test may be stopped prior to the completion of all of its planned testing cycles only when both the first electronic component and the second electronic component are determined to be in a non-operational state.

In some examples, operation 102 may further determine an elapsed time period associated with the first configuration. In some examples, the elapsed time period may be an amount of time that has passed since the system was placed in the first configuration. In some examples, the elapsed time period may be an amount of time that the first electronic component has been exposed to the first temperature and the second electronic component has been exposed to the second temperature. In some examples, the elapsed time period may be used to determine when to proceed to operation 144.

At operation 144, the process may include determining to transition the system from the first configuration to a second configuration. In some examples, the transition may be determined based at least in part on determining that the elapsed time period associated with the first configuration reaching an elapsed time threshold. In some examples, the elapsed time threshold may be a predetermined constant and stored in a memory associated with the system. In some examples, a user may set the elapsed time threshold prior to starting example process 100 using the user interface associated with the system. In some examples, the elapsed time threshold may be determined to be thirty minutes or more. In some examples, the system may automatically transition from the first configuration to the second configuration once the elapsed time reaches the elapsed time threshold. In some examples, the system may inform the user that the elapsed time has reached the elapsed time threshold via the user interface and the user may manually command the system to transition from the first configuration to the second configuration via the user interface.

In some examples, the second configuration may include the same components as the first configuration. In the example second configuration 142, the second configuration may also include the first thermal shock unit 106, the second thermal shock unit 108, the first temperature regulator 110, the second temperature regulator 112, the first temperature sensor 114, the second temperature sensor 116, the third temperature sensor 118, the fourth temperature sensor 120, the first flow sensor 122, the second flow sensor 124, the third flow sensor 126, and fourth flow sensor 128, the first inlet valve 130, the first outlet valve 132, the second inlet valve 134, the second outlet valve 136, the first state determinator 138, and the second state determinator 140. In some examples, all of the aforementioned components may retain the same functions as described in associated with the example first configuration 104 above.

In some examples, during the transition from the example first configuration 104 to the example second configuration 142, the system may, for the first inlet valve 130, close the inlet that is associated with the first temperature regulator 110 (illustrated as dashed lines within the example second configuration 142) and open the inlet that is associated with the second temperature regulator 112 (illustrated as solid lines within the example second configuration 142). In some examples, during the transition, the system may, for the first outlet valve 132, close the outlet associated with the first temperature regulator 110 (also illustrated as dashed lines within the example second configuration 142) and open the outlet valve associated with the second temperature regulator 112 (also illustrated with solid line within the example second configuration 142). In some examples, during the transition, the system may, for the second inlet valve, close the inlet associated with the second temperature regulator 112 (also illustrated as dashed lines within the example second configuration 142) and open the inlet associated with the first temperature regulator 110. In some examples, during the transition, the system may, for the second outlet valve 136, close the outlet associated with the second temperature regulator 112 (also illustrated as dashed lines within the example second configuration 142) and open the outlet associated with the first temperature regulator 110 (also illustrated as solid lines within the example second configuration 142).

In some examples, upon completion of the transition to the example second configuration 142, operationally, the first fluid may flow from the first temperature regulator 110 through the second thermal shock unit 108 and return to the first temperature regulator 110 and the second fluid may flow from the second temperature regulator 112 through the first thermal shock unit 106 and return to the second temperature regulator 112. As a result, in some examples, upon completion of the transition, the first electronic component associated with the first thermal shock unit 106 may be exposed to the second temperature and the second electronic component associated with the second thermal shock unit 108 may be exposed to the second temperature.

In some examples, the system may be kept in the second configuration until a second elapsed time threshold (e.g., when a second elapsed time associated with the second configuration reaches the second elapsed time threshold). In some examples, the second elapsed time threshold may be the same as the elapsed time threshold. In some examples, the second elapsed time threshold may be different from the elapsed time threshold. In some examples, similar to the elapsed time threshold, the second elapsed time threshold may be predetermined or user-defined. In some examples, upon reaching the second elapsed time threshold, the system may perform one or more actions such as transitioning from the second configuration back to the first configuration and/or determining an operational state associated with the first electronic component and/or the second electronic component.

At operation 144, the process may include determining a transition time period associated with the transition. In some examples, the transition time period may be user-defined (e.g., via the user interface) or predetermined.

In some examples, although the respective inlets and outlets are closed, residuals of the first fluid may mix with the second fluid and therefore, the change in temperature may not be instantaneous as the first temperature regulator 110 and the second temperature regulator 112 requires time to transition the mixed fluid to the first temperature to the second temperature. In some examples, the transition time period may be determined based on one or more transition factors such as the thermal properties associated with first fluid and the second fluid (e.g., a specific heat associated with the first and second fluids), the cooling capacity associated with the first temperature regulator 110 (e.g., the rate at which the first temperature regulator 110 may transition the residual second fluid to the first temperature), the heating capacity associated with the second temperature regulator 112 (e.g., the rate at which the second temperature regulator 112 may transition the residual first fluid to the second temperature), and/or the like. In some examples, the transition time period may be determined to be the minimum amount necessary based on the transition factors (e.g., 2 minute or less) such that the first electronic component may experience as close to a sudden or instantaneous transition from one temperature extreme (e.g. the first temperature) to a thermally opposite second temperature extreme (e.g., the second temperature) and/or the second electronic component may experience the as close to the sudden or instantaneous transition from one temperature extreme (e.g., the second temperature) to the thermally opposite second temperature extreme (e.g., the first temperature), thereby experiencing a thermal shock during the transition. In some examples, the transition time period may be determined based on a specific heat associated with the first fluid, a specific heat associated with the second fluid, a specific heat capacity associated with the first temperature regulator 110, a specific heat capacity associated with the second temperature regulator 112, and/or the like.

At operation 146, the process can further include determining a first transition flow rate and a second transition flow rate. In some examples, the first transition flow rate may be associated with the second flow sensor 124 and the second transition flow rate may be associated with third flow sensor 126. In some examples, the first transition flow rate may be associated with the second fluid flowing toward the first thermal shock unit 106. In some examples, the second transition flow rate may be associated with the first fluid flowing toward the second thermal shock unit 108.

In some examples, the first transition flow rate and/or the second transition flow rate may be determined based at least in part on the transition time period. In some examples, a change in rate from the first temperature to the second temperature may be determined to be constant, and in such an example, the first flow rate may be determined to be constant through the transition. In some examples, a change in rate from the second temperature to the first temperature may be determined constant, and in such an example, the second flow rate may be determined to be constant through the transition. In some examples, the first transition flow rate may be the different from the second flow rate. In some examples, this difference in the first transition flow rate and the second transition flow rate may be due to a difference in energy required to transition from a higher temperature to a lower temperate (e.g., from the second temperature to the first temperature) versus the transition from a lower temperature to a higher temperature (e.g., from the first temperature to the second temperature). In some examples, in the event that the energy required the energy required is the same, the first transition flow rate may be the same as the second transition flow rate.

In some examples, the first transition flow rate determined at operation 144 may be an initial first transition flow rate. In such an example, the first transition flow rate may be dynamically adjusted. In some examples, this dynamic adjustment may be necessary because the change in temperature from the first temperature to the second temperature does not proceed at a constant rate. In some examples, the first transition flow rate may be dynamically adjusted in order for the transition in temperature from the first temperature to the second temperature to be completed within the transition time period. In such an example, it may be determined that the initial first transition flow rate may be too slow or too fast to complete the transition. In some examples, the first transition flow rate may be dynamically adjusted based on a rate of temperature change at the first temperature sensor 114. In some examples, the rate of temperature change at the first temperature sensor 114 may be below a first temperature change threshold. In some examples, the first transition flow rate may be adjusted based on the rate of temperature change at the first temperature sensor 114 being below the first temperature change threshold. In some examples, the first transition flow rate may be dynamically adjusted based on a rate of change of the temperature difference between the first temperature sensor 114 and the second temperature sensor 116. In some examples, the first transition flow rate may be dynamically adjusted by evaluating the flow rate as measured at the second flow sensor 124 in view with the rate of temperature change at the first temperature sensor 114 and/or the rate of temperature difference change at the first temperature sensor 114 and the second temperature sensor 116.

In some examples, the second transition flow rate determined at operation 144 may be an initial second transition flow rate. In such an example, the second transition flow rate may be dynamically adjusted. In some examples, this dynamic adjustment may be necessary because the change in temperature from the second temperature to the first temperature does not proceed at a constant rate. In some examples, the second transition flow rate may be dynamically adjusted in order for the transition in temperature from the second temperature to the first temperature to be completed within the transition time period. In such an example, it may be determined that an initial second transition flow rate may be too slow or too fast to complete the transition. In some examples, the second transition flow rate may be dynamically adjusted based on a rate of temperature change at the third temperature sensor 118. In some examples, the rate of temperature change at the third temperature sensor 118 may be below a second temperature change threshold. In some examples, the second transition flow rate may be adjusted based on the rate of temperature change at the third temperature sensor 118 being below the second temperature change threshold. In some examples, the second transition flow rate may be dynamically adjusted based on a rate of temperature difference change at the third temperature sensor 118 and the fourth temperature sensor 120. In some examples, the transition flow rate may be dynamically adjusted by evaluating the flow rate as measured at the third flow sensor 126 in view with the rate of temperature change at the third temperature sensor 118 and/or the rate of temperature difference change at the third temperature sensor 118 and the fourth temperature sensor 120.

At operation 148, the process can include executing the transition. In some examples, the operation 146 can include closing the inlet of the first inlet valve 130 that is associated with the first temperature regulator 110 and opening the inlet of the first inlet valve 130 that is associated with the second temperature regulator 112, closing the outlet of the first outlet valve 132 that is associated with the first temperature regulator 110 and opening the outlet of the first outlet valve 132 that is associated with the second temperature regulator 112, closing the inlet of the second inlet valve 134 that is associated with second temperature regulator 112 and opening the inlet of the second inlet valve 134 that is associated with the first temperature regulator 110, and closing the outlet of the second outlet valve 136 that is associated with the second temperature regulator 112 and opening the outlet of the second outlet valve 136 that is associated with the first temperature regulator 110.

In some examples, the operation 150 can include executing the transition for the duration of the transition time period determined at the operation 144 and at the first transition flow rate and the second transition flow rate determined at the operation 144. In some examples, during the transition, the system can continuously monitor the flow rate at each of the second flow sensor 124 and the third flow sensor 126 in real time or substantially real time. In some examples, during the transition, the system can monitor the flow rate at each of the second flow sensor 124 and the third flow sensor 126 at a set interval of time (e.g., every 5 seconds). In some examples, the set interval of time may be predetermined or user-defined via the user interface.

In some examples, the system may monitor and record the temperature at the first temperature sensor 114, the second temperature sensor 116, the third temperature sensor 118, and the fourth temperature sensor 120. In some examples, the system may determine, from the measurement associated with each of the first temperature sensor 114, the second temperature sensor 116, the third temperature sensor 118, and the fourth temperature sensor 120, a rate of change in temperature associated with each of the first temperature sensor 114, the second temperature sensor 116, the third temperature sensor 118, and the fourth temperature sensor 120. In some examples, all of the aforementioned temperature sensor related measurements and determinations may be performed a set interval of time (e.g., every 5 seconds) or continuously in real-time or substantially real-time. In some examples, the set interval of time may be predetermined or user-defined via the user interface.

In some examples, the rate of temperature change at least the first temperature sensor and/or the third temperature sensor may be continuously determined (e.g., either in real time or at a set interval of time) in order to dynamically adjust the first transition flow rate and/or the second transition flow rate. In some examples, as previously discussed above, the first transition flow rate and/or the second transition flow rate determined at the operation 144 may be insufficient to for the transition from the first temperature to the second temperature and/or the second temperature to the first temperature within the transition time period. In such an example, the flow rate associated with the first fluid and/or the second fluid may be dynamically adjusted based on the rate of temperature change at the first temperature sensor and/or the rate of temperature change at the second temperature sensor in order to allow the temperature transition to complete within the transition time period. For example, the system may increase the first transition flow rate if the rate of temperature change at the first temperature sensor indicates that the current first transition flow rate may be too slow.

Figure 2:
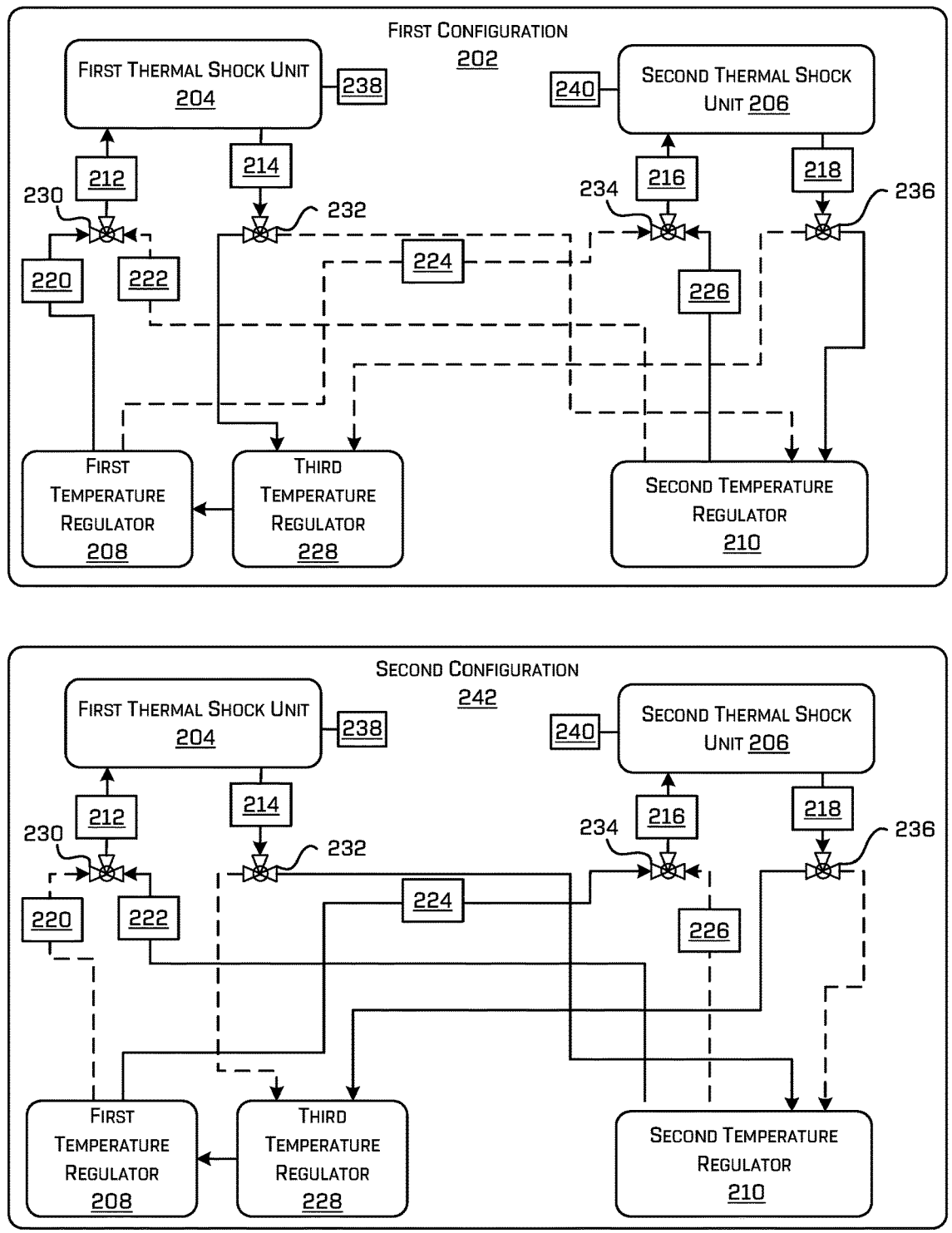
FIG. 2 is an illustration of alternative examples of the system for thermal shock testing.

FIG. 2 is an illustration of an example system 200 of a thermal shock system. The example system 200 includes an example first configuration 202 and an example second configuration 242. In some examples, the example first configuration 202 and the example second configuration 242 may be alternative configurations to the example first configuration 104 and the example second configuration 142 respectively from FIG. 1.

Example system 200 may include a first thermal shock unit 204, a second thermal shock unit 206, a first temperature regulator 208, the second temperature regulator 210, a third temperature regulator 228, a first temperature sensor 212, a second temperature sensor 214, a third temperature sensor 216, a fourth temperature sensor 218, a first flow sensor 220, a second flow sensor 222, a third flow sensor 224, a fourth flow sensor 226, a first inlet valve 230, a first outlet valve 232, a second inlet valve 234, and a second outlet valve 236. The temperature regulators may also be referred to as temperature regulating devices.

In some examples, the first thermal shock unit 204 may house or otherwise be thermally coupled with a first electronic component, whereby during the example first configuration 202, a first fluid maintained at a first temperature may travel from the first temperature regulator 208 through the first inlet valve 230, into the first thermal shock unit 204 via an inlet associated with the first thermal shock unit 204, out of the first thermal shock unit 106 via an outlet associated with the first thermal shock unit 204, through the first outlet valve 232, to the third temperature regulator 228, and finally back to the first temperature regulator 208. In some examples, the first thermal shock unit 204 may correspond to the first thermal shock unit 106 described in association with FIG. 1. In some examples, similar to the first thermal shock unit 106, the first thermal shock unit 204 may be an integrated part of the first electronic component. In some examples, this pathway may be closed loop. In some examples, the first electronic component may be a PCB similar to the first electronic component as described in association with FIG. 1. In some examples, the first thermal shock unit 106 may alternatively be associated with multiple electronic components. The first thermal shock unit 106 is further discussed in association with FIG. 3, as well as throughout this disclosure.

In some examples, the second thermal shock unit 206 may house or otherwise thermally coupled with a second electronic component whereby during the example first configuration 202, a second fluid maintained at a second temperature may travel from the second temperature regulator 210 through the second inlet valve 234, into the second thermal shock unit 206 via an inlet associated with the second thermal shock unit 206, out of the second thermal shock unit 206 via an outlet associated with the second thermal shock unit 206, through the second outlet valve 236, and back to the second temperature regulator 210. In some examples, the second thermal shock unit 206 may correspond to the second thermal shock unit 108 described in association with FIG. 1. In some examples, similar to the second thermal shock unit 108 described in association with FIG. 1, the second thermal shock unit 206 may be an integrated part of the second electronic component. In some examples, similar to the fluid pathway between the first temperature regulator 208 and the first thermal shock unit 204, this pathway may also be closed loop. In some examples, the second circuit board may be a PCB similar to the first electronic component described in association with FIG. 1. In some examples, the second thermal shock unit 206 may alternatively be associated with multiple electronic components. The second thermal shock unit 206 is further discussed in association with FIG. 3, as well as throughout this disclosure.

In some examples, the first temperature regulator 208 may be associated with both the first thermal shock unit 204 and the second thermal shock unit 206. In some examples, the first fluid may be maintained at the first temperature within the first temperature regulator 208. In some examples, the first temperature regulator 208 may correspond to the first temperature regulator 208 described in association with FIG. 1. In some examples, the first temperature may be predetermined temperatures. In some examples, the first temperature may be adjusted by a user via a user interface associated with the example system 200. In some examples, the first temperature may be determined to be at or below a first temperature threshold (e.g., at or below -10 Celsius). In some examples, the first fluid may be comprised of one or more liquids. In some examples, the first fluid may alternatively be comprised of one or more gases.

In some examples, the first temperature regulator 208 may be associated with the third temperature regulator 228. In some examples, the first temperature regulator 208 and the third temperature regulator 228 may have the same size and may have the same volume. In some examples, the third temperature regulator 228 may be configured to maintain the first fluid at the first temperature. In some examples, the first temperature regulator 208 and the third temperature regulator 228 may have different sizes and volumes. In some examples, the third temperature regulator 228 may receive the first fluid from the first thermal shock unit 204. In some examples, the first fluid returning from the first thermal shock unit 204 may be at a different temperature than the first temperature. In such an example, the first fluid from the first thermal shock unit 204 may be stored within the third temperature regulator 228 until the first fluid returns to the first temperature, and the first fluid may be transferred to the first temperature regulator 208 upon returning to the first temperature. In some examples, the third temperature regulator may include a volume sensor configured to determine the volume of the first fluid within the third temperature regulator 228. In some examples, the volume sensor may determine whether the volume of the first fluid meets or exceeds a maximum volume threshold. In some examples, when the volume of the first fluid meets or exceeds the volume threshold, the first fluid may be transferred to the first temperature regulator 208 to prevent overflow.

In some examples, the first temperature regulator 208 may also include a volume sensor. In some examples, the first fluid within the third temperature regulator 228 may be transferred to the first temperature regulator 208 when the volume sensor associated with the first temperature regulator 208 determines that that a volume of the first fluid within the first temperature regulator 208 is at or below a minimum volume threshold. In some examples, the volume sensor associated with the first temperature regulator 208 and the volume sensor associated with the third temperature regulator 228 may operate in combination during the transfer of the first fluid from the third temperature regulator 228. In some examples, the volume sensor associated with the first temperature regulator 208 and the volume sensor associated with the third temperature regulator 228 may be used to maintain equal volume between the first temperature regulator 208 and the third temperature regulator 228.

In some examples, the second temperature regulator 210 may also be associated with both the first thermal shock unit 204 and the second thermal shock unit 206. In some examples, the second fluid may be maintained at a second temperature within the second temperature regulator 210. In some examples, the second temperature regulator 210 may corresponding to the first temperature regulator 110 described in association with FIG. 1. In some examples, the second temperature may be a predetermined temperature. In some examples, the second temperature may be determined to be at or above a second temperature threshold (e.g., at or above 75 Celsius). In some examples the first temperature threshold may be a lower temperature than the second temperature threshold. In some examples, the first temperature and the second temperature may be determined based on a difference between the first temperature and the second temperature exceeding a third temperature threshold. In some examples, the first fluid and the second fluid may be comprised of one or more liquids. In some examples, the second fluid may alternatively be comprised of one or more gases.

In some examples, the first temperature sensor 212 may be positioned proximate the inlet associated with the first thermal shock unit 204 and the second temperature sensor 214 may be positioned proximate the outlet associated with the first thermal shock unit 204, whereby the first temperature sensor 212 may be used to determine a first temperature associated with the first fluid at the inlet associated with the first thermal shock unit 204 and the second temperature sensor 214 may be used to determine a second temperature associated with the first fluid at the outlet associated with the first thermal shock unit 204. In some examples, the first temperature sensor 212 and the second temperature sensor 214 may correspond to the first temperature sensor 114 and the second temperature sensor 116 described in association with FIG. 1. In some examples, the first temperature sensor 212 and the second temperature sensor 214 may be used to determine a difference between the first temperature and the second temperature.

In some examples, the third temperature sensor 216 may be positioned proximate the inlet associated with the second thermal shock unit 206 and the fourth temperature sensor 218 may be positioned proximate the outlet associated with the second thermal shock unit 206, whereby the third temperature sensor 216 may be used to determine a third temperature associated with the second fluid at the inlet associated with the second thermal shock unit 206 and the fourth temperature sensor 218 may be used to determine a fourth temperature associated with the second fluid at the outlet associated with the second thermal shock unit 206. In some examples, the third temperature sensor 216 and the fourth temperature sensor 218 may correspond to the third temperature sensor 118 and the fourth temperature sensor 120 described in association with FIG. 1. In some examples, the third temperature sensor 216 and the fourth temperature sensor 218 may be used to determine a difference between the third temperature and the fourth temperature.

In some examples, the first inlet valve 230 may be associated with the inlet associated with the first thermal shock unit 204. In some examples, the first inlet valve 230 may correspond to the first inlet valve 130 described in association with FIG. 1. In some examples, the first inlet valve 230 may be operationally connected to or otherwise associated with both the first temperature regulator 208 and the second temperature regulator 210. In some examples, the first inlet valve 230 may be a three-way valve, whereby the first inlet valve 230 may comprise two inlets, one operationally connected to the first temperature regulator 208 and one operationally connected to the second temperature regulator 210, and one outlet which may be operationally connected to the first thermal shock unit 204. In some examples, only one of the inlets associated with the first inlet valve 230 may be open and permit the one of the first fluid or the second fluid to pass through to the first thermal shock unit 204 based on a current configuration of the system 200. In the example of the example first configuration 202, the inlet operationally connected to the first temperature regulator 208 may be open (illustrated in FIG. 2 as a solid line) while the inlet operationally connected to the second temperature regulator 210 may be closed (illustrated in FIG. 2 as a dashed line), thereby permitting the first fluid to flow from the first temperature regulator 208 to the first thermal shock unit 204 while preventing the second fluid from flowing to the first thermal shock unit 204. In the example of the example second configuration 242, the inlet operationally connected to the second temperature regulator 210 may be open while the inlet operationally connected to the first temperature regulator 208 may be closed, thereby allowing the second fluid to flow from the second temperature regulator 210 to the first thermal shock unit 204 while preventing the first fluid from flowing to the first thermal shock unit 204.

In some examples, the first outlet valve 232 may be associated with the outlet associated with the first thermal shock unit 204. In some examples, the first outlet valve 232 may correspond to the first outlet valve 132 described in association with FIG. 1. In some examples, the first outlet valve 232 may be operationally connected to both the third temperature regulator 228 and the second temperature regulator 210. In some examples, the first outlet valve 232 may also be a three-way valve, whereby the first outlet valve 232 may comprise two outlets, one operationally connected to the third temperature regulator 228 and one operationally connected to the second temperature regulator 210, and one inlet which may be operationally connected to the first thermal shock unit 204. In some examples, only one outlet between the two outlets associated with the first outlet valve 232 may be open and permit one of the first fluid or the second fluid to pass through to one of the third temperature regulator 228 or the second temperature regulator 210 based on the current configuration of the system 200. In the example of example first configuration 202, the outlet operationally connected to the third temperature regulator 228 may be open (illustrated in FIG. 2 as a solid line) while the outlet operationally connected to the second temperature regulator 210 may be closed (illustrated in FIG. 2 as a dashed line), thereby permitting the first fluid to flow from the first thermal shock unit 204 to third temperature regulator 228 while preventing the first fluid from flowing into the second temperature regulator 210. In the example of example second configuration 242, the outlet operationally connected to the second temperature regulator 210 may be open while the outlet operationally connected to the third temperature regulator 228 may be closed.

In some examples, the second inlet valve 234 may be associated with the inlet associated with the second thermal shock unit 206. In some examples, the second inlet valve 234 may correspond to the second inlet valve 134 described in association with FIG. 1. In some examples, the second inlet valve 234 may be operationally connected to both the first temperature regulator 208 and the second temperature regulator 210. In some examples, the second inlet valve 234 may also be a three-way valve, whereby the second inlet valve 234 may also comprise two inlets, one operationally connected to the first temperature regulator 208 and one operationally connected to the second temperature regulator 210, and one outlet which may be operationally connected to the second thermal shock unit 108. In some examples, only one inlet between the two inlets associated with the second inlet valve 134 may be open and permit one of the first fluid or the second fluid to pass through to the second thermal shock unit 206 based on the current configuration of the system 200. In the example of the example first configuration 104, the inlet operationally connected to the second temperature regulator 210 may be open (illustrated in FIG. 2 as a solid line) while the inlet operationally connected to the first temperature regulator 208 may be closed (illustrated in FIG. 2 as a dashed line), thereby permitting the second fluid to flow from the second temperature regulator 210 to the second thermal shock unit 206 while preventing the first fluid from flowing to the second thermal shock unit 206. In the example of the example second configuration 242, the inlet operationally connected to the first temperature regulator 208 may be open while the inlet operationally connected to the second temperature regulator 210 may be closed.

In some examples, the second outlet valve 236 may be associated with the outlet associated with the second thermal shock unit 206. In some examples, the second outlet valve 236 may correspond to the second outlet valve 136 described in association with FIG. 1. In some examples, the second outlet valve 236 may be operationally connected to both the third temperature regulator 228 and the second temperature regulator 210. In some examples, the second outlet valve 236 may also be a three-way valve, whereby the second outlet valve 236 may comprise two outlets, one operationally connected to the third temperature regulator 228 and one operationally connected to the second temperature regulator 210, and one inlet which is operationally connected to the second thermal shock unit 206. In some examples, only one outlet between the two outlets associated with the second outlet valve 236 may be open and permit one of the first fluid or the second fluid to pass through to one of the third temperature regulator 228 or the second temperature regulator 210 based on the current configuration of the system 200. In the example of the example first configuration 202, the outlet operationally connected to the second temperature regulator 210 may be open (illustrated in FIG. 2 as a solid line) while the outlet operationally connected to the third temperature regulator 228 may be closed (illustrated in FIG. 2 as a dashed line), thereby permitting the second fluid to flow from the second thermal shock unit 206 to the second temperature regulator 210 while preventing the second fluid from flowing into the third temperature regulator 228. In the example of the example second configuration 242, the outlet operationally connected to the third temperature regulator 228 may be open while the outlet operationally connected to the second temperature regulator 210 may be closed.

In some examples, the first flow sensor 220 may be positioned proximate the inlet of the first inlet valve 230 that is associated with the first temperature regulator 208. In some examples, the first flow sensor 220 may correspond to the first flow sensor 122 described in association with FIG. 1. In some examples, the first flow sensor 220 may be used to determine a first flow rate associated with the first fluid flowing from first temperature regulator 208 toward the first thermal shock unit 204. In the example of the example first configuration 202, because the inlet associated with the first temperature regulator 208 is open, the first flow sensor 122 may measure a flow rate greater than zero. In the example of the example second configuration 242, because the inlet associated with the first temperature regulator is closed, the first flow sensor 122 may measure a flow rate of zero or approximately zero.

In some examples, the second flow sensor 222 may be positioned proximate the inlet of the first inlet valve 230 that is operationally connected to the second temperature regulator 210. In some examples, the second flow sensor 222 may correspond to the second flow sensor 124 described in association with FIG. 1. In some examples, the second flow sensor 222 may be used to determine a flow rate of the second fluid flowing from the second temperature regulator 210 toward the first thermal shock unit 204. In the example of the example first configuration 202, because the inlet associated with the second temperature regulator 210 is closed, the second flow sensor 222 may measure a flow rate of zero or approximately zero. In the example of the example second configuration 242, because the inlet associated with the second temperature regulator is open, the second flow sensor 222 may measure a flow rate of greater than zero.

In some examples, the first flow sensor 220 and/or the second flow sensor 222 may operate in conjunction or in connection with the first temperature sensor 212 and/or the second temperature sensor 214, whereby, the flow rate of the first fluid and/or the second fluid may be dynamically adjusted to maintain the first temperature or the second temperature and/or to maintain a target temperature difference threshold between the first temperature sensor 212 and the second temperature sensor 214. In some examples, the target temperature difference threshold may be zero or approximately zero. In other examples, the target temperature difference threshold may be non-zero. Additionally or alternatively, in some examples, the first flow sensor 220 and/or the second flow sensor 222 may be used to determine whether the first inlet valve 230 is operating as intended. For example, in the event that both the first flow sensor 220 and the second flow sensor 222 measure a flow rate greater than zero when at least one of the inlets should be closed, the system may determine, as a result, that both inlets associated with the first inlet valve 230 may be open. In such an example, the system may log a warning and/or notify a user via a user interface associated with the system that the first inlet valve 230 may be faulty.

In some examples, the third flow sensor 224 may be positioned proximate the inlet of the second inlet valve 234 that is associated with the first temperature regulator 208. In some examples, the third flow sensor 224 may correspond to the third flow sensor 126 described in association with FIG. 1. In some examples, the third flow sensor 224 may be used to determine a flow rate associated with the first fluid flowing from first temperature regulator 208 toward the second thermal shock unit 206. In the example of the example first configuration 202, because the inlet associated with the first temperature regulator 208 is closed, the third flow sensor 224 may measure a flow rate of zero or approximately zero. In the example of the example second configuration 242, because the inlet associated with the first temperature regulator 208 is open, the third flow sensor may measure a flow rate of greater than zero.

In some examples, the fourth flow sensor 226 may be positioned proximate the inlet of the second inlet valve 234 that is operationally connected to the second temperature regulator 210. In some examples, the fourth flow sensor 226 may correspond to the fourth flow sensor 128 described in association with FIG. 1. In some examples, the fourth flow sensor 226 may be used to determine a flow rate of the second fluid flowing from the second temperature regulator 210 toward the second thermal shock unit 206. In the example of the example first configuration 202, because the inlet associated with the second temperature regulator 210 is open, the fourth flow sensor 226 may measure a flow rate of greater than zero. In the example of the example second configuration 242, because the inlet associated with the second temperature regulator 210 is closed, the fourth flow sensor 226 may measure a flow rate of zero or approximately zero.

In some examples, the third flow sensor 224 and/or the fourth flow sensor 226 may operate in conjunction with the third temperature sensor 216 and the fourth temperature sensor 218, whereby, the flow rates of the first fluid and/or the second fluid may be dynamically adjusted to maintain the first temperature or the second temperature and/or maintain a target temperature difference threshold between the third temperature sensor 216 and the fourth temperature sensor 218. In some examples, the target temperature difference threshold may be zero or approximately zero. In other examples, the target temperature difference threshold may be non-zero. Additionally or alternatively, in some examples, the third flow sensor 224 and/or the fourth flow sensor 226 may be used to determine whether the second inlet valve 234 is operating as intended. For example, in the event that both the third flow sensor 224 and the fourth flow sensor 226 measure a flow rate greater than zero when at least one of the inlets should be closed, the system may determine, as a result, that both inlets associated with the second inlet valve 234 may be open. In such an example, the system may log a warning and/or notify a user via a user interface associated with the system that the second inlet valve 234 may be faulty.

In some examples, the first state determinator 238 may be configured to determine an operational state of the first electronic component. In some examples, the first state determinator 238 may continuously determine the operational state of the first electronic component in real time while the thermal shock system is testing the first electronic component. Alternatively, the first state determinator 238 may be configured to determine the operational state of the first electronic component at particular intervals such as before and/or after each operation within the process 100. In some examples, the first state determinator 238 may create a log of the operational state of the first electronic component and/or add to the log when the first state determinator 238 determines the operational state of the first electronic component. In some examples, the first state determinator 238 may be configured to stop the thermal shock test when it determines that the first electronic component is in a non-operational state even if the thermal shock test has not completed all of its planned cycles.

In some examples, the second state determinator 240 may be configured to determine an operational state of the second electronic component. In some examples, the second state determinator 240 may continuously determine the operational state of the second electronic component in real time while the thermal shock system is testing the second electronic component. Alternatively, the second state determinator 240 may be configured to determine the operational state of the second electronic component at particular intervals such as such as before and/or after each operation within the process 100. In some examples, the second state determinator 240 may create a log of the operational state of the second electronic component and/or add to the log when the second state determinator 240 determines the operational state of the second electronic component. In some examples, the second state determinator 240 may be configured to stop the thermal shock test when it determines that the second electronic component is in a non-operational state even if the thermal shock test has not completed all of its planned cycles. In some examples, the thermal shock test may be stopped prior to the completion of all of its planned testing cycles only when both the first electronic component and the second electronic component are determined to be in a non-operational state.

Figure 3:
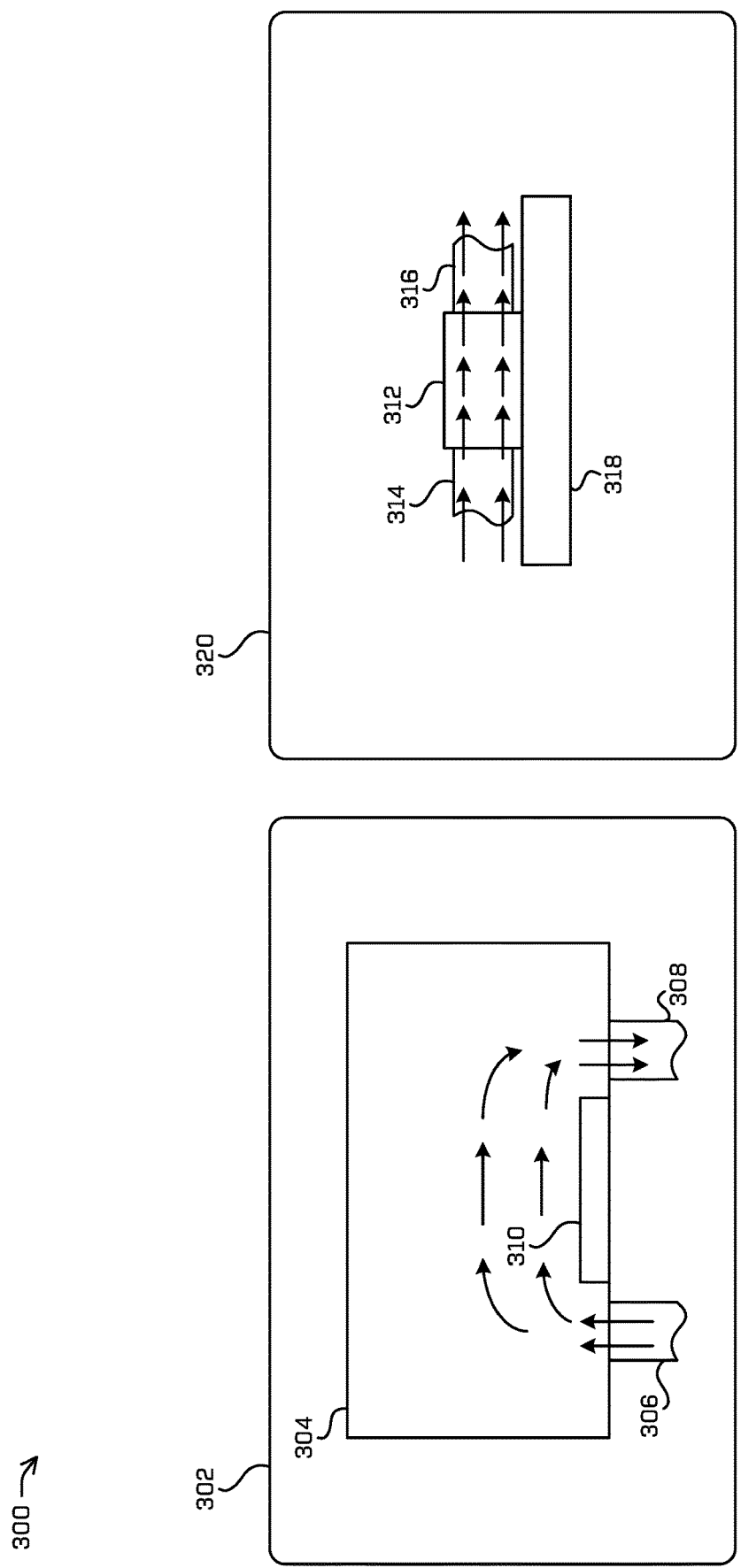
FIG. 3 is an illustration of examples arrangements of a thermal shock unit.

FIG. 3 is an illustration of an example 300 of a thermal shock unit. In examples, the thermal shock unit may provide an interface between fluid, e.g., heated or cooled fluid as discussed herein, and an electrical component to be tested. The example 300 illustrates two possible arrangements for the thermal shock unit, including an example first arrangement 302 and an example second arrangement 320. In some examples, the arrangements 302, 320 may be the first thermal shock units 106, 204 and/or the second thermal shock units 108, 206 as illustrated in, and detailed in connection with, FIGS. 1 and 2.

The example first arrangement 302 includes a unit 304, an inlet 306, an outlet 308, and an electronic component 310. The example first arrangement 302 illustrates an example arrangement of the thermal shock unit where the electronic component 310 is placed entirely within the unit 304. For example, the unit 304 may be a housing, container, vessel, or other structure that defines a volume configured to retain the electronic component 310 therein. In some examples, the inlet 306 may correspond to or be associated with one of the first inlet valves 130, 230 and/or the second inlet valves 134, 234. In some examples, the outlet 308 may correspond to or be associated with one of the first outlet valves 132, 232 and/or the second outlet valve 136, 236. In some examples, a fluid (e.g., the first fluid or the second fluid) may enter the unit 304 via the inlet 306 and exit the unit 304 via the outlet 308 (illustrated in the example first arrangement 302 with directional arrows). In some examples, the fluid may be at a first temperature (e.g., at or below −10 Celsius) or a second temperature (e.g., at or above 75 Celsius). In some examples, when the fluid passes through the unit 304, the fluid may directly interface with the electronic component 310. In some examples, because the electronic component 310 may be powered on while the fluid is passing through the unit 304, the fluid may be non-electrically conductive. In some examples, the fluid may be a liquid (e.g., a coolant). In some examples, the fluid may alternatively be a gas (e.g., air).

The example second arrangement 320 includes a unit 312, an inlet 314, an outlet 316, and an electronic component 318. In some examples, the fluid may enter the unit 312 through the inlet 314 and exit the unit 312 through the outlet 316 (as illustrated in the example second arrangement 320 with directional arrows). For example, the unit 304 may be a housing, container, vessel, or other structure that defines a volume configured to allow the fluid to pass through from inlet 314 to the outlet 316. In some examples, the unit 312 may be a thermal chamber that is coupled to the electronic component 318 and configured regulate a temperature of the electronic component 318 (e.g., a heat sink, a heat pipe, a vapor chamber, a cold plate, and/or the like). In such an example, the unit 312 may be a component that is configured to regulate the temperature of the electronic component 318 while the electronic component 318 is in use during normal operation and may also be coupled and/or attached to a thermal shock system such as the thermal shock system described in association with FIGS. 1 and 2 when a thermal shock test is performed on the electronic component 318. Furthermore, in such an example, the unit 312 may be configured to allow a liquid to pass through its thermal chamber, wherein, during the normal operation, the liquid passing through the unit 312 may be configured to thermally regulate the electronic component 318 to and/or below a threshold temperature while, during the thermal shock test, the liquid passing through the unit 312 may be at least one of the first fluid or the second fluid described in association with FIGS. 1 and 2, as well as throughout this disclosure. In some examples, the inlet 314 may correspond to or be associated with one of the first inlet valves 130, 230 and/or the second inlet valves 134, 234. In some examples, the outlet 316 may correspond to or be associated with one of the first outlet valves 132, 232 and/or the second outlet valve 136, 236. In some examples, the unit 312 may be configured to directly interface with the electronic component 318 while the fluid does not directly interface with the electronic component 318. In some examples, portion(s) of the surface of the unit 312 (e.g., the bottom surface) configured to directly interface with the electronic component 318 may be thermally conductive (e.g., the bottom surface of the unit 312 may comprise thermally conductive metal) and thereby thermally passing the temperature from the fluid to the electronic component 318 without requiring the fluid to directly interface with the electronic component 318. In some examples, the portion(s) of the unit 312 that are configured to interface with the electronic component 318 may be configured to contact one or more portions of the electronic component 318 (e.g., portions of the electronic component 318 that may include soldering) that are vulnerable to failures due to temperature extremes or rapid changes between temperature extremes (e.g., to thermal shocks). In some examples, the fluid may be non-electrically conductive. In some examples, the fluid may be a liquid (e.g., a coolant). In some examples, the fluid may alternatively be a gas (e.g., air).

Alternatively, in some examples, the unit 312 may be an active thermal exchange component (e.g., an active cooling component or an active heating component) that is part of the electronic component 318. For example, the unit 312 may be soldered to, integrated with, or otherwise coupled to the electronic component 318 and/or non-destructively removable from the electronic component 318. Examples of the unit 312 may be a cold plate, a vapor chamber, heat pipe, or the like. Unit 312 may be used as a heatsink during non-test uses. For example, unit 312 may interface with a liquid cooling system while in a product or commercial configuration. The product or commercial configuration may be include coupling the heatsink to a liquid pump and/or reservoir as part of a larger assembly. Reusing the same heatsink from production enables like components to be used for testing and production, reducing cost and time associated with validation and reconfiguring the components for test. Reuse of the same heatsink may include coupling the heatsink to a fluid transfer conduit or tube and then decoupling the heatsink after test so that it remains on the electronic component 318. The electronic component 318 may then be used in a production or commercial setting without removing the heat sink.

Figure 4:
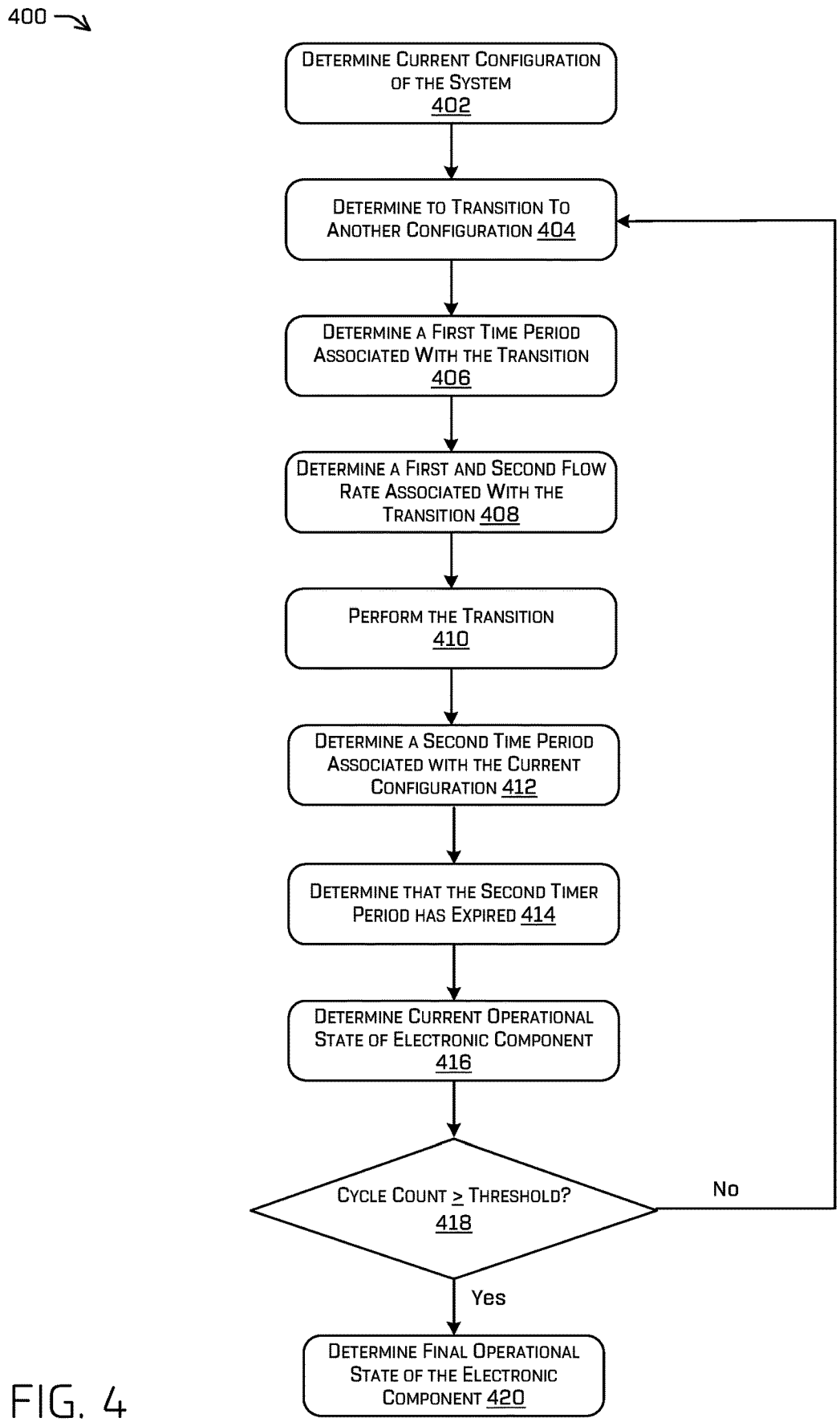
FIG. 4 is an example process for operating a thermal shock test system.

FIG. 4 illustrates an example process 400 for operating a thermal shock test system. In some examples, some or all of the process 400 may be performed by one or more components in FIGS. 1-3, as described herein. In some examples, some or all of the process 400 may be performed or executed by one or more processors associated with the thermal shock test system. In some examples, some or all of the process 400 may be stored as computer-readable instructions that is stored within a non-transitory computer readable media (e.g. a memory associated with the thermal shock test system) and executable by the one or more processors. In some examples, the thermal shock test system is configured to perform a thermal shock test on an electronic component.

At operation 402, the process may include determining a current configuration of the thermal shock system. In some examples, the current configuration may be a first configuration or a second configuration as illustrated in FIGS. 1 and 2. Additional details associated with operation 402 are discussed in connection with FIGS. 1 and 2, as well as throughout this disclosure.

At operation 404, the process may include determining whether to transition to another configuration (e.g., transition from the first configuration to the second configuration or the second configuration to the first configuration). Additional details associated with operation 404 are discussed in connection with FIGS. 1 and 2, as well as throughout this disclosure.

At operation 406, the process may include determining a first time period associated with the transition. In some examples, the first time period may be a same or similar time period as the transition time period discussed in association with FIG. 1. Additional details associated with operation 406 are discussed in connection with FIGS. 1 and 2, as well as throughout this disclosure.

At operation 408, the process may include determining a first flow rate and a second flow rate associated with the transition. Additional details associated with operation 408 are discussed in connection with FIGS. 1 and 2, as well as throughout this disclosure.

At operation 410, the process can include performing the transition. Additional details associated with operation 410 are discussed in connection with FIGS. 1 and 2, as well as throughout this disclosure.

At operation 412, the process can include determining a second time period associated with a current configuration. In some examples, the current configuration at the operation 412 may be the configuration that the system transitions to (e.g., the second configuration if the transition is from the first configuration to the second configuration). In some examples, the second time period may be an elapsed period of time associated with the amount of time that the system is in the current configuration. In some examples, the second time period may be continuously determined either in real time or at a set time interval. In some examples, the second time period may be evaluated against a time threshold.

At operation 414, the process can include determining whether the second time period has reached or exceeded the time threshold. In some examples, the time threshold may be a maximum elapsed time that the system may stay in a particular configuration before transitioning to another configuration. In some examples, the time threshold may be a constant, predetermined threshold. In some examples, the time threshold may be generated by a user using a user interface associated with the system.

At operation 416, the process can include determining an operational state of an electronic component being thermally tested during the process 400. In some examples the electronic component may be an electronic component described in association with FIGS. 1-3, as well as throughout this disclosure. In some examples, the operation 416 may be performed by a state determinator corresponding to one of the first state determinator 138, the second state determinator 140, the first state determinator 238, or the second state determinator 240 described in association with FIGS. 1 and 2. In some examples, the operational state of the electronic component may be determined, as illustrated, after an elapsed time associated with a configuration and/or after the transition. In some examples, the operational state of the electronic component may be continuously determined in real time such as during each of the operations of the process 400.

In some examples, during the process 400, the electronic component may be electrically connected and powered on. In some examples, prior to starting the process 400, an initial operational state of electronic component may be determined to ensure that the electronic component is operating as intended. In some examples, this determination may be performed electrically, visually, and/or the like. In some examples, if the electronic component is determined at the operation 416 to be non-functional, a further determination may be performed on the electronic component to determine which portion of the electronic component may have been rendered non-functional by the process 400. In some examples, this further determination may additionally determine whether the electronic component was rendered non-functional due to the process 400 or due to an unrelated factor. Additional details associated with operation 410 are discussed in connection with FIGS. 1 and 2, as well as throughout this disclosure.

At operation 418, the process can include determining whether a cycle count associated with the process 400 has reached or exceeded a cycle count threshold. In some examples, each time the system transitions between the configurations, the cycle count may incrementally increases by one. In some examples, the cycle count threshold may be a maximum amount of times that the system transitions between the configurations before an operational state of a circuit board being tested by the system is determined. In some examples, the cycle count threshold may be a constant, predetermined threshold. In some examples, the cycle count threshold may be generated by the user via the user interface. If the cycle count is determined to meet or exceed the cycle count threshold, then the process 400 proceeds to operation 420. If the cycle count does not meet or exceed the cycle count threshold, then the process 400 returns to the operation 404.

At the operation 420, the process can include determining a final operation state of the electronic component. In some examples, once the cycle count has been determined to meet or exceed the cycle count threshold, the electronic component is checked at the operation 420 to determine whether it is operating as intended. In some examples, this determination may also be performed electrically, visually, and/or the like. In some examples, if the electronic component is determined at the operation 420 to be non-functional, a further determination may be performed on the electronic component to determine which portion of the electronic component may have been rendered non-functional by the process 400. In some examples, this further determination may additionally determine whether the electronic component was rendered non-functional due to the process 400 or due to an unrelated factor.

Figure 5:
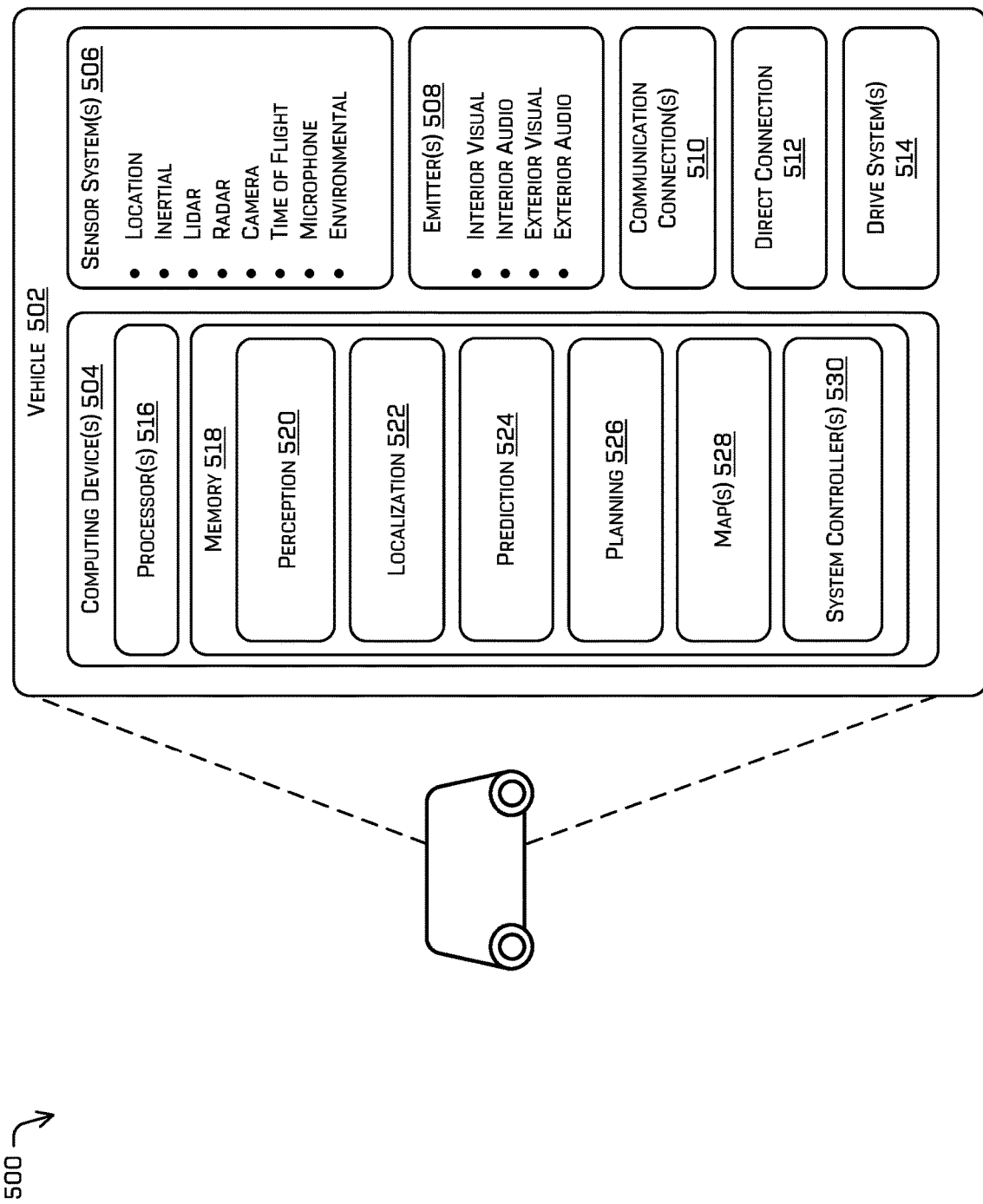

FIG. 5 depicts a block diagram of an example system 500 that a thermal shock test using the techniques described herein may be performed on. In at least one example, the system 500 may include a vehicle 502. In the illustrated example system 500, the vehicle 502 is an autonomous vehicle; however, the vehicle 502 may be any other type of vehicle.

In some examples, the vehicle 502 may be a driverless vehicle, such as an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In such examples, because the vehicle 502 may be configured to control all functions from start to completion of the trip, including all parking functions, it may not include a driver and/or controls for driving the vehicle 502, such as a steering wheel, an acceleration pedal, and/or a brake pedal. This is merely an example, and the systems and methods described herein may be incorporated into any ground-borne, airborne, or waterborne vehicle, including those ranging from vehicles that need to be manually controlled by a driver at all times, to those that are partially or fully autonomously controlled.

The vehicle 502 may include one or more computing device(s) 504, one or more sensor system(s) 506, one or more emitter(s) 508, one or more communication connection(s) 510 (also referred to as communication devices and/or modems), at least one direct connection 512 (e.g., for physically coupling with the vehicle 502 to exchange data and/or to provide power), and one or more drive system(s) 514. The one or more sensor system(s) 506 may be configured to capture sensor data associated with an environment.

In some examples, at least each of the computing device(s) 504, the sensor systems(s) 506, the emitter(s) 508, the communication connection(s) 510, the drive system(s) 514 may be modular and coupled to separate thermal regulating components (e.g. thermal chambers such as heat sinks) configured to regulate the temperature of each of the computing device(s) 504, the sensor systems(s) 506, the emitter(s) 508, the communication connection(s) 510, the drive system(s) 514 while the vehicle 502 is performing its normal operations. Examples of modular vehicular components can be found can be found, for example, in U.S. Pat. No. 9,494,940 titled "Quadrant Configuration of Robotic Vehicles" and issued Nov. 15, 2016, the entirety of which is herein incorporated by reference in its entirety for all purposes. In some examples, the thermal regulating components may correspond to the thermal shock units described in association with FIGS. 1 and 2. Additionally, in some examples, these thermal regulating components may be coupled to a thermal test system corresponding to the thermal shock test system described in association with FIGS. 1 and 2 during the operations of a thermal shock test on one or more of the computing device(s) 504, the sensor systems(s) 506, the emitter(s) 508, the communication connection(s) 510, the drive system(s) 514. In some examples, the thermal regulating component may correspond to the thermal shock unit described in association with FIG. 3, as well as throughout this disclosure.

The one or more sensor system(s) 506 may include time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. The one or more sensor system(s) 506 may include multiple instances of each of these or other types of sensors. For instance, the time-of-flight sensors may include individual time-of-flight sensors located at the corners, front, back, sides, and/or top of the vehicle 502. As another example, the camera sensors may include multiple cameras disposed at various locations about the exterior and/or interior of the vehicle 502. The one or more sensor system(s) 506 may provide input to the computing device 504.

The vehicle 502 may also include one or more emitter(s) 508 for emitting light and/or sound. The one or more emitter(s) 508 in this example include interior audio and visual emitters to communicate with passengers of the vehicle 502. By way of example and not limitation, interior emitters may include speakers, lights, signs, display screens, touch screens, haptic emitters (e.g., vibration and/or force feedback), mechanical actuators (e.g., seatbelt tensioners, seat positioners, headrest positioners, etc.), or the like. The one or more emitter(s) 508 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which may comprise acoustic beam steering technology.

The vehicle 502 may also include one or more communication connection(s) 510 that enable communication between the vehicle 502 and one or more other local or remote computing device(s) (e.g., a remote teleoperation computing device) or remote services. For instance, the one or more communication connection(s) 510 may facilitate communication with other local computing device(s) on the vehicle 502 and/or the one or more drive system(s) 514. Also, the one or more communication connection(s) 510 may allow the vehicle 502 to communicate with other nearby computing device(s) (e.g., other nearby vehicles, traffic signals, etc.).

The one or more communications connection(s) 510 may include physical and/or logical interfaces for connecting the computing device 504 to another computing device or one or more external networks (e.g., the Internet). For example, the one or more communications connection(s) 510 may enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.), satellite communication, dedicated short-range communications (DSRC), or any suitable wired or wireless communications protocol that enables the respective computing device to interface with the other computing device(s).

In at least one example, the vehicle 502 may include one or more drive system(s) 514. In some examples, the vehicle 502 may have a single drive system 514. In at least one example, if the vehicle 502 has multiple drive systems 514, individual drive systems 514 may be positioned on opposite ends of the vehicle 502 (e.g., the front and the rear, etc.). In at least one example, the drive system(s) 514 may include one or more sensor system(s) 506 to detect conditions of the drive system(s) 514 and/or the surroundings of the vehicle 502. By way of example and not limitation, the sensor system(s) 506 may include one or more wheel encoders (e.g., rotary encoders) to sense rotation of the wheels of the drive systems, inertial sensors (e.g., inertial measurement units, accelerometers, gyroscopes, magnetometers, etc.) to measure orientation and acceleration of the drive system, cameras or other image sensors, ultrasonic sensors to acoustically detect objects in the surroundings of the drive system, lidar sensors, radar sensors, etc. Some sensors, such as the wheel encoders may be unique to the drive system(s) 514. In some cases, the sensor system(s) 506 on the drive system(s) 514 may overlap or supplement corresponding systems of the vehicle 502 (e.g., sensor system(s) 506).

The drive system(s) 514 may include many of the vehicle systems, including a high voltage battery, a motor to propel the vehicle, an inverter to convert direct current from the battery into alternating current for use by other vehicle systems, a steering system including a steering motor and steering rack (which may be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 514 may include a drive system controller which may receive and preprocess data from the sensor system(s) 506 and to control operation of the various vehicle systems. In some examples, the drive system controller may include one or more processor(s) and memory communicatively coupled with the one or more processor(s). The memory may store one or more components to perform various functionalities of the drive system(s) 514. Furthermore, the drive system(s) 514 also include one or more communication connection(s) that enable communication by the respective drive system with one or more other local or remote computing device(s).

The computing device 504 may include one or more processor(s) 516 and memory 518 communicatively coupled with the one or more processor(s) 516. In the illustrated example, the memory 518 of the computing device 504 stores a perception component 520, a localization component 522, a prediction component 524, a planning component 526, a maps component 528, and one or more system controller(s) 530. Though depicted as residing in the memory 518 for illustrative purposes, it is contemplated that the perception component 520, the localization component 522, the prediction component 524, the planning component 526, the maps component 528, and the one or more system controller(s) 530 may additionally, or alternatively, be accessible to the computing device 504 (e.g., stored in a different component of vehicle 502) and/or be accessible to the vehicle 502 (e.g., stored remotely).

The perception component 520 may include functionality to perform object detection, segmentation, and/or classification. In some examples, the perception component 520 may provide processed sensor data that indicates a presence of an entity that is proximate to the vehicle 502 and/or a classification of the entity as an entity type (e.g., car, pedestrian, cyclist, building, tree, road surface, curb, sidewalk, unknown, etc.). In additional and/or alternative examples, the perception component 520 may provide processed sensor data that indicates one or more characteristics associated with a detected entity and/or the environment in which the entity is positioned. In some examples, characteristics associated with an entity may include, but are not limited to, an x-position (global position), a y-position (global position), a z-position (global position), an orientation, an entity type (e.g., a classification), a velocity of the entity, an extent of the entity (size), etc. Characteristics associated with the environment may include, but are not limited to, a presence of another entity in the environment, a state of another entity in the environment, a time of day, a day of a week, a season, a weather condition, an indication of darkness/light, etc.

Further, the perception component 520 may include functionality to store perception data generated by the perception component 520. In some instances, the perception component 520 may determine a track corresponding to an object that has been classified as an object type. For purposes of illustration only, the perception component 520, using sensor system(s) 506 may capture one or more images of an environment. The sensor system(s) 506 may capture images of an environment that includes an object, such as a pedestrian. The pedestrian may be at a first position at a time T and at a second position at time T+t (e.g., movement during a span of time t after time T). In other words, the pedestrian may move during this time span from the first position to the second position. Such movement may, for example, be logged as stored perception data associated with the object.

The stored perception data may, in some examples, include fused perception data captured by the vehicle. Fused perception data may include a fusion or other combination of sensor data from sensor system(s) 506, such as image sensors, lidar sensors, radar sensors, time-of-flight sensors, sonar sensors, global positioning system sensors, internal sensors, and/or any combination of these. The stored perception data may additionally or alternatively include classification data including semantic classifications of objects (e.g., pedestrians, vehicles, buildings, road surfaces, etc.) represented in the sensor data. The stored perception data may additionally or alternatively include track data (positions, orientations, sensor features, etc.) corresponding to motion of objects classified as dynamic objects through the environment. The track data may include multiple tracks of multiple different objects over time. This track data may be mined to identify images of certain types of objects (e.g., pedestrians, animals, etc.) at times when the object is stationary (e.g., standing still) or moving (e.g., walking, running, etc.). In this example, the computing device determines a track corresponding to a pedestrian.

The localization component 522 may include functionality to receive data from the sensor system(s) 506 and/or other components to determine a position of the vehicle 502. For example, the localization component 522 may include and/or request/receive a three-dimensional map of an environment and may continuously determine a location of the autonomous vehicle within the map. In some instances, the localization component 522 may use SLAM (simultaneous localization and mapping) or CLAMS (calibration, localization and mapping, simultaneously) to receive time-of-flight data, image data, lidar data, radar data, sonar data, IMU data, GPS data, wheel encoder data, or any combination thereof, or the like to accurately determine a location of the autonomous vehicle. In some instances, the localization component 522 may provide data to various components of the vehicle 502 to determine an initial position of an autonomous vehicle for generating a trajectory, as discussed herein.

The prediction component 524 may generate one or more probability maps representing prediction probabilities of possible locations of one or more objects in an environment. For example, the prediction component 524 may generate one or more probability maps for vehicles, pedestrians, animals, or the like within a threshold distance from the vehicle 502. In some instances, the prediction component 524 may measure a track of an object and generate a discretized prediction probability map, a heat map, a probability distribution, a discretized probability distribution, and/or a trajectory for the object based on observed and predicted behavior. In some instances, the one or more probability maps may represent an intent of the one or more objects in the environment.

The planning component 526 may determine a path for the vehicle 502 to follow to traverse through an environment. For example, the planning component 526 may determine various routes and paths and various levels of detail. In some instances, the planning component 526 may determine a route to travel from a first location (e.g., a current location) to a second location (e.g., a target location). For the purpose of this discussion, a route may be a sequence of waypoints for traveling between two locations. As non-limiting examples, waypoints include streets, intersections, global positioning system (GPS) coordinates, etc. Further, the planning component 526 may generate an instruction for guiding the autonomous vehicle along at least a portion of the route from the first location to the second location. In at least one example, the planning component 526 may determine how to guide the autonomous vehicle from a first waypoint in the sequence of waypoints to a second waypoint in the sequence of waypoints. In some examples, the instruction may be a path, or a portion of a path. In some examples, multiple paths may be substantially simultaneously generated (i.e., within technical tolerances) in accordance with a receding horizon technique. A single path of the multiple paths in a receding data horizon having the highest confidence level may be selected to operate the vehicle.

In other examples, the planning component 526 may alternatively, or additionally, use data from the perception component 520 and/or the prediction component 524 to determine a path for the vehicle 502 to follow to traverse through an environment. For example, the planning component 526 may receive data from the perception component 520 and/or the prediction component 524 regarding objects associated with an environment. Using this data, the planning component 526 may determine a route to travel from a first location (e.g., a current location) to a second location (e.g., a target location) to avoid objects in an environment. In at least some examples, such a planning component 526 may determine there is no such collision free path and, in turn, provide a path which brings vehicle 502 to a safe stop avoiding all collisions and/or otherwise mitigating damage.

The memory 518 may further include one or more maps 528 that may be used by the vehicle 502 to navigate within the environment. For the purpose of this discussion, a map may be any number of data structures modeled in two dimensions, three dimensions, or N-dimensions that are capable of providing information about an environment, such as, but not limited to, topologies (such as intersections), streets, mountain ranges, roads, terrain, and the environment in general. A map may further include an object identifier, an object classification, a three-dimensional location, covariance data (e.g., represented in image data or a multi-resolution voxel space), or the like. In some instances, a map may include, but is not limited to: texture information (e.g., color information (e.g., RGB color information, Lab color information, HSV/HSL color information), or the like), intensity information (e.g., LIDAR information, RADAR information, or the like); spatial information (e.g., image data projected onto a mesh, individual "surfels" (e.g., polygons associated with individual color and/or intensity)), reflectivity information (e.g., specularity information, retroreflectivity information, BRDF information, BSSRDF information, or the like). In one example, a map may include a three-dimensional mesh of the environment. In some instances, the map may be stored in a tiled format, such that individual tiles of the map represent a discrete portion of an environment, and may be loaded into working memory as needed, as discussed herein. In at least one example, the one or more maps 528 may include at least one map (e.g., images and/or a mesh). In some examples, the vehicle 502 may be controlled based at least in part on the map(s) 528. That is, the map(s) 528 may be used in connection with the perception component 520 (and sub-components), the localization component 522 (and sub-components), the prediction component 524, and/or the planning component 526 to determine a location of the vehicle 502, identify objects in an environment, generate prediction probabilit(ies) associated with objects and/or the vehicle 502, and/or generate routes and/or trajectories to navigate within an environment.

In at least one example, the computing device 504 may include one or more system controller(s) 530, which may be configured to control steering, propulsion, braking, safety, emitters, communication, and other systems of the vehicle 502. These system controller(s) 530 may communicate with and/or control corresponding systems of the drive system(s) 514 and/or other components of the vehicle 502, which may be configured to operate in accordance with a path provided from the planning component 526.

The processor(s) 516 of the computing device 504 may be any suitable processor capable of executing instructions to process data and perform operations as described herein. By way of example and not limitation, the processor(s) 516 may comprise one or more Central Processing Units (CPUs), Graphics Processing Units (GPUs), or any other device or portion of a device that processes electronic data to transform that electronic data into other electronic data that may be stored in registers and/or memory. In some examples, integrated circuits (e.g., ASICs, etc.), gate arrays (e.g., FPGAs, etc.), and other hardware devices may also be considered processors in so far as they are configured to implement encoded instructions.

The memory 518 may be a non-transitory computer-readable media. The memory 518 may store an operating system and one or more software applications, instructions, programs, and/or data to implement the methods described herein and the functions attributed to the various systems. In various implementations, the memory 518 may be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein may include many other logical, programmatic, and physical components, of which those shown in the accompanying Figures are merely examples that are related to the discussion herein In some instances, aspects of some or all of the components discussed herein may include any models, algorithms, and/or machine-learning algorithms. For example, in some instances, the components in the memory 518 may be implemented as a neural network.

In some examples, the neural network may train a machine learned model that may determine a condition of one or more vehicle components such as a condition of a tire. The neural network may receive a reference data set of images of tires labeled with new tire conditions and training data sets of images of tires labeled based on one or more tire conditions. The training data sets may include images of tires at different types of tire conditions and a different wear levels of each particular tire condition. In some examples, the label may be tread depth. The images may be indicative of different levels of wear of the tire such each with different level of tread depths that are indicative of gradual wear of the tire. In some examples, the label may be distance traveled by the tire. In some examples, the label may be other types of tire wear such as puncture, uneven wear, and/or mis-alignment of tire. In some examples, vehicle 502 may determine the condition of the tire based on the machine learned model. In some examples, the neural network may train machine learned models to determine wear levels of different conditions of other vehicle components (e.g., motor, brakes, suspensions, drivetrain, joints, sensors, and/or the like).

As described herein, an exemplary neural network is an algorithm that passes input data through a series of connected layers to produce an output. Each layer in a neural network may also comprise another neural network, or may comprise any number of layers (whether convolutional or not). As may be understood in the context of this disclosure, a neural network may utilize machine learning, which may refer to a broad class of such algorithms in which an output is generated based on learned parameters.

Although discussed in the context of neural networks, any type of machine learning may be used consistent with this disclosure. For example, machine learning or machine-learned algorithms may include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), instance-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (ID3), Chi-squared automatic interaction detection (CHAID), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, hopfield network, Radial Basis Function Network (RBFN)), deep learning algorithms (e.g., Deep Boltzmann Machine (DBM), Deep Belief Networks (DBN), Convolutional Neural Network (CNN), Stacked Auto-Encoders), Dimensionality Reduction Algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Algorithms (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc.

Additional examples of architectures include neural networks such as ResNet50, ResNet101, VGG, DenseNet, PointNet, or the like.

FIGS. 1 and 4 illustrate example processes in accordance with examples of the disclosure. These processes are illustrated as a logical flow graph, each operation of which represents a sequence of operations that may be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, or the like that perform particular functions or implement particular abstract data types. The order in which the operations are described is not intended to be construed as a limitation, and any number of the described operations may be omitted or combined in any order and/or in parallel to implement the processes.

EXAMPLE CLAUSES

A: A system comprising: a first thermal shock unit thermally coupled to a first circuit board and configured to thermally regulate a first temperature associated with the first circuit board; a second thermal shock unit thermally coupled to a second circuit board and configured to thermally regulate a second temperature associated with the second circuit board; a first temperature regulator configured to cool a first fluid to a first temperature; a second temperature regulator configured to heat a second fluid to a second temperature; one or more inlet conduits configured to provide the fluids from the thermal regulators to the thermal shock units; one or more inlet valves configured to selectively fluidically couple the thermal regulators and the thermal shock units; one or more processors; one or more non-transitory computer-readable media storing instructions that, when executed by the one or more processors, causes the one or more processors to perform operations comprising: determining that the system is associated with a first configuration, in which a first valve of the one or more inlet valves passes the first fluid from a first inlet conduit into thermal contact with the first thermal shock unit and a second valve of the one or more inlet valves passes the second fluid from a second inlet conduit into thermal contact with the second thermal shock unit; determining to transition the system from the first configuration to a second configuration, in which, during the second configuration, the first valve passes the second fluid from a third inlet conduit into thermal contact with the first thermal shock unit and the second valve passes the first fluid from a fourth inlet conduit into thermal contact with the second thermal shock unit; transitioning the system from the first configuration to the second configuration; and determining, after the transition, an operational state associated with at least one of the first circuit board or the second circuit board.

B: The system of paragraph A, wherein the first thermal shock unit is a heat sink thermally coupled to the first circuit board and configured to allow at least one of the first fluid or the second fluid to pass through the heat sink to regulate temperature of at least a component of the circuit board during non-testing operations; and wherein during the first configuration, the first fluid comes into thermal contact with the first circuit board when the first fluid passed through the heat sink.

C: The system of paragraph A or B, wherein the first valve comprises: the first inlet in fluid communication with the first temperature regulator; the second inlet in fluid communication with the second temperature regulator; and an outlet in fluid communication with the first thermal shock unit; and wherein the second valve comprises: the third inlet in fluid communication with the first temperature regulator; the fourth inlet in fluid communication with the second temperature regulator; and a second outlet in fluid communication with the second thermal shock unit; and wherein transitioning from the first configuration to the second configuration comprises: closing the first inlet; opening the second inlet; opening the third inlet; and closing the fourth inlet.

D: The system of any of paragraphs A-C, further comprising: a first flow sensor positioned proximate the fourth inlet conduit and configured to determine a first flow rate associated with the second fluid; and a second flow sensor positioned proximate the third inlet conduit and configured to determine a second flow rate associated with the first fluid.

E: The system of any of paragraphs A-D, the operations further comprising: determining a cycle count representing an amount of time the system has transitioned between the first configuration and the second configuration; wherein determining the operational state of at least one of the first circuit board or the second circuit board comprises: determining, based at least in part on the cycle count meeting or exceeding a cycle count threshold, the operational state of the at least one of the first circuit board or the second circuit board.

F: A thermal shock testing system comprising: a first temperature regulating device configured to cool a first fluid to a first temperature as a cooled fluid; a second temperature regulating device configured to heat a second fluid to a second temperature as a heated fluid; and one or more inlet valves in fluid communication with the first temperature regulating device and the second temperature regulating device, wherein the thermal shock testing system is configurable in: a first configuration in which the one or more inlet valves pass the cooled fluid into thermal contact with an electronic component, and a second configuration in which the one or more inlet valves pass the heated fluid into thermal contact with the electronic component.

G: The thermal shock testing system of paragraph F, further comprising: a temperature sensor positioned proximate an outlet associated with the one or more inlet valves and configured to determine a temperature of at least one of the cooled fluid or the heated fluid; and a flow sensor positioned proximate an inlet conduit connected to an inlet of the one or more inlet valves and configured to determine a flow rate of at least one of the cooled fluid or the heated fluid.

H: The thermal shock testing system of paragraph F or G, further comprising: a third thermal regulating device in fluid communication with the first temperature regulating device and the electronic component, wherein the third thermal regulating device is configured to cool the cooled fluid returning from the electronic component to the first temperature.

I: The thermal shock testing system of any of paragraphs F-H, wherein the electronic component is thermally coupled to a thermal chamber configured to thermally regulate a temperature of the electronic component; and wherein, during the first configuration, the cooled fluid comes into thermal contact with the electronic component when the cooled fluid passes from the one or more inlet valves into the thermal chamber.

J: The thermal shock testing system of any of paragraphs F-I, wherein the one or more inlet valves comprises a first inlet valve and a second inlet valve; wherein the electronic component is a first electronic component; wherein, during the first configuration, the first inlet valve passes the cooled fluid into thermal contact with the first electronic component and the second inlet valve passes the heated fluid into thermal contact with a second electronic component; and wherein, during the second configuration, the first inlet valve passes the heated fluid into thermal contact with the first electronic component and the second inlet valve passes the cooled fluid into thermal contact with the second electronic component.

K: The thermal shock testing system of any of paragraphs F-J, further comprising an enclosed unit, wherein the electronic component is disposed within the enclosed unit and the one or more inlet valves passes at least one of the cooled fluid or heated fluid into the enclosed unit to facilitate thermal contact with the electronic component.

L: The thermal shock testing system of any of paragraphs F-K, wherein the one or more inlet valves is coupled to an inlet of an active thermal transfer component on the electronic component.

M: A testing apparatus comprising a controller configured to: determine that the testing apparatus is in a first configuration, in which a first inlet valve passes a fluid cooled to a first temperature as a cooled fluid into thermal contact with a first thermal shock unit and a second inlet valve passes the fluid heated to a second temperature as a heated fluid into thermal contact with a second thermal shock unit; determine to transition the testing apparatus from the first configuration to a second configuration, in which, during the second configuration, the first inlet valve passes the heated fluid into thermal contact with the first thermal shock unit and the second inlet valve passes the cooled fluid into thermal contact with the second thermal shock unit; and transition from the first configuration to the second configuration, wherein transitioning from the first configuration to the second configuration comprises: closing the first inlet valve; and opening the second inlet valve.

N: The testing apparatus of paragraph M, wherein the controller is further configured to: determine that a cycle count representing an amount of time that the testing apparatus has transitioned between the first configuration and the second configuration is less than a cycle count threshold; and incrementing, based at least in part on the transition from the first configuration to the second configuration, the cycle count.

O: The testing apparatus of paragraph N, wherein the controller is further configured to: determine, after incrementing the cycle count, that the cycle count is less than the cycle count threshold; transitioning, based at least in part on the cycle count being less than the cycle count threshold, the testing apparatus from the second configuration to the first configuration; and incrementing, based at least in part on the transition from the second configuration to the first configuration, the cycle count.

P: The testing apparatus of paragraph O, wherein transitioning from the second configuration to the first configuration comprises: determining an elapsed time associated with the second configuration; and transitioning, based on the elapsed time meeting or exceeding an elapsed time threshold, the testing apparatus from the second configuration to the first configuration.

Q: The testing apparatus of any of paragraphs M-P, wherein the controller is further configured to: determine continuously, during at least the first configuration, the transition, and the second configuration, an operational state associated with a first electronic component thermally coupled to the first thermal shock unit.

R: The testing apparatus of any of paragraphs M-Q, wherein the first thermal shock unit is coupled to a first electronic component and configured to thermally regulate the first electronic component and the second thermal shock unit is coupled to a second electronic component and configured to thermally regulate the second electronic component, wherein, during the first configuration, the cooled fluid is thermally coupled the first electronic component when the cooled fluid passes through the first thermal shock unit and the heated fluid is thermally coupled the second electronic component when the heated fluid passes through the second thermal shock unit.

S: The testing apparatus of paragraph R, wherein the first thermal shock unit is an active thermal transfer component of the first electronic component and the second thermal shock unit is an active thermal transfer component of the second electronic component.

T: The testing apparatus of paragraph R or S, wherein the controller is further configured to: determine that a cycle count representing an amount of time that the testing apparatus has transitioned between the first configuration and the second configuration meets or exceeds a cycle count threshold; and determine, based at least in part on the cycle count meeting or exceeding the cycle count threshold, an operational state of at least one of the first electronic component or the second electronic component.

While the example clauses described above are described with respect to one particular implementation, it should be understood that, in the context of this document, the content of the example clauses can also be implemented via a method, device, system, a computer-readable medium, and/or another implementation. Additionally, any of examples A-T may be implemented alone or in combination with any other one or more of the examples A-T.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples may be used and that changes or alterations, such as structural changes, may be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A thermal shock testing system comprising:
   a first temperature regulating device configured to cool a first fluid to a first temperature as a cooled fluid;
   a second temperature regulating device configured to heat a second fluid to a second temperature as a heated fluid, wherein the first temperature is lower than the second temperature; and
   one or more inlet valves in fluid communication with the first temperature regulating device and the second temperature regulating device, wherein the thermal shock testing system is configurable in:
   a first configuration in which the one or more inlet valves pass the cooled fluid into thermal contact with an electronic component, wherein the one or more inlet valves comprises a first inlet valve and a second inlet valve, and wherein during the first configuration, the first inlet valve passes the cooled fluid into thermal contact with the electronic component and the second inlet valve passes the heated fluid into thermal contact with a second electronic component, and
   a second configuration in which the one or more inlet valves pass the heated fluid into thermal contact with the electronic component.

2. The thermal shock testing system of claim 1, further comprising:
   a temperature sensor positioned proximate an outlet associated with the one or more inlet valves and configured to determine a temperature of at least one of the cooled fluid or the heated fluid; and
   a flow sensor positioned proximate an inlet conduit connected to an inlet of the one or more inlet valves and configured to determine a flow rate of at least one of the cooled fluid or the heated fluid.

3. The thermal shock testing system of claim 1, further comprising:
   a third thermal regulating device in fluid communication with the first temperature regulating device and the electronic component,
   wherein the third thermal regulating device is configured to cool the cooled fluid returning from the electronic component to the first temperature.

4. The thermal shock testing system of claim 1, wherein the electronic component is thermally coupled to a thermal chamber configured to thermally regulate a temperature of the electronic component; and
   wherein, during the first configuration, the cooled fluid comes into thermal contact with the electronic component when the cooled fluid passes from the one or more inlet valves into the thermal chamber.

5. The thermal shock testing system of claim 1,
   wherein the electronic component is a first electronic component; and
   wherein, during the second configuration, the first inlet valve passes the heated fluid into thermal contact with the first electronic component and the second inlet valve passes the cooled fluid into thermal contact with the second electronic component.

6. The thermal shock testing system of claim 1, further comprising an enclosed unit,
   wherein the electronic component is disposed within the enclosed unit and the one or more inlet valves passes at least one of the cooled fluid or heated fluid into the enclosed unit to facilitate thermal contact with the electronic component.

7. The thermal shock testing system of claim 1, wherein the one or more inlet valves is coupled to an inlet of an active thermal transfer component on the electronic component.

8. A system comprising:
   a first temperature regulating device configured to cool a first fluid to a first temperature as a cooled fluid;
   a second temperature regulating device configured to heat a second fluid to a second temperature as a heated fluid, wherein the first temperature is lower than the second temperature; and
   one or more inlet valves in fluid communication with the first temperature regulating device and the second temperature regulating device, wherein the system is configurable in:

a first configuration in which the one or more inlet valves pass the cooled fluid into thermal contact with a first electronic component, and a second configuration in which the one or more inlet valves pass the heated fluid into thermal contact with the first electronic component, wherein the one or more inlet valves comprises a first inlet valve and a second inlet valve, and wherein, during the second configuration, the first inlet valve passes the heated fluid into thermal contact with the first electronic component and the second inlet valve passes the cooled fluid into thermal contact with a second electronic component.

9. The system of claim 8, further comprising:

a temperature sensor positioned proximate an outlet associated with the one or more inlet valves and configured to determine a temperature of at least one of the cooled fluid or the heated fluid; and a flow sensor positioned proximate an inlet conduit connected to an inlet of the one or more inlet valves and configured to determine a flow rate of at least one of the cooled fluid or the heated fluid.

10. The system of claim 8, further comprising:

a third thermal regulating device in fluid communication with the first temperature regulating device and the first electronic component, wherein the third thermal regulating device is configured to cool the cooled fluid returning from the first electronic component to the first temperature.

11. The system of claim 8, wherein the first electronic component is thermally coupled to a thermal chamber configured to thermally regulate a temperature of the first electronic component; and wherein, during the first configuration, the cooled fluid comes into thermal contact with the first electronic component when the cooled fluid passes from the one or more inlet valves into the thermal chamber.

12. The system of claim 8, wherein, during the first configuration, the first inlet valve passes the cooled fluid into thermal contact with the first electronic component and the second inlet valve passes the heated fluid into thermal contact with a second electronic component.

13. The system of claim 8, further comprising an enclosed unit, wherein the first electronic component is disposed within the enclosed unit and the one or more inlet valves passes at least one of the cooled fluid or heated fluid into the enclosed unit to facilitate thermal contact with the first electronic component.

14. The system of claim 8, wherein the one or more inlet valves is coupled to an inlet of an active thermal transfer component on the first electronic component.

15. A method comprising:

determining that a system is in a first configuration, in which a first inlet valve passes a fluid cooled to a first temperature as a cooled fluid into thermal contact with a first electronic component and a second inlet valve passes the fluid heated to a second temperature as a heated fluid into thermal contact with a second electronic component;

determining to transition the system from the first configuration to a second configuration, in which, during the second configuration, the first inlet valve passes the heated fluid into thermal contact with the first electronic component and the second inlet valve passes the cooled fluid into thermal contact with the second electronic component; and transitioning from the first configuration to the second configuration, wherein transitioning from the first configuration to the second configuration comprises:

closing the first inlet valve; and opening the second inlet valve.

16. The method of claim 15, wherein the system comprises:

a temperature sensor positioned proximate an outlet associated with one or more inlet valves and configured to determine a temperature of at least one of the cooled fluid or the heated fluid; and a flow sensor positioned proximate an inlet conduit connected to an inlet of the one or more inlet valves and configured to determine a flow rate of at least one of the cooled fluid or the heated fluid.

17. The method of claim 15, wherein the system comprises:

a thermal regulating device in fluid communication with a temperature regulating device and the first electronic component, wherein the thermal regulating device is configured to cool the cooled fluid returning from the first electronic component to the first temperature.

18. The method of claim 15, wherein the first electronic component is thermally coupled to a thermal chamber configured to thermally regulate a temperature of the first electronic component; and wherein, during the first configuration, the cooled fluid comes into thermal contact with the first electronic component when the cooled fluid passes from one or more inlet valves into the thermal chamber.

19. The method of claim 15, wherein the system comprises:

an enclosed unit, wherein the first electronic component is disposed within the enclosed unit and one or more inlet valves passes at least one of the cooled fluid or heated fluid into the enclosed unit to facilitate thermal contact with the first electronic component.

20. The method of claim 15, wherein one or more inlet valves are coupled to an inlet of an active thermal transfer component on the first electronic component.

\* \* \* \* \*